US009831316B2

(12) United States Patent
Inoue et al.

(10) Patent No.: US 9,831,316 B2
(45) Date of Patent: Nov. 28, 2017

(54) SEMICONDUCTOR DEVICE AND METHOD OF MANUFACTURING SEMICONDUCTOR DEVICE

(71) Applicant: SHINDENGEN ELECTRIC MANUFACTURING CO., LTD., Chiyoda-ku, Tokyo (JP)

(72) Inventors: Tetsuto Inoue, Saitama (JP); Akihiko Sugai, Saitama (JP); Shunichi Nakamura, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/303,730

(22) PCT Filed: Jul. 10, 2015

(86) PCT No.: PCT/JP2015/069943
§ 371 (c)(1),
(2) Date: Oct. 12, 2016

(87) PCT Pub. No.: WO2016/006696
PCT Pub. Date: Jan. 14, 2016

(65) Prior Publication Data
US 2017/0040423 A1 Feb. 9, 2017

(30) Foreign Application Priority Data

Jul. 11, 2014 (JP) .................................. 2014-143224

(51) Int. Cl.
*H01L 29/40* (2006.01)
*H01L 29/66* (2006.01)
(Continued)

(52) U.S. Cl.
CPC ............ *H01L 29/407* (2013.01); *H01L 29/06* (2013.01); *H01L 29/0696* (2013.01);
(Continued)

(58) Field of Classification Search
CPC ... H01L 29/407; H01L 29/06; H01L 29/0696; H01L 29/1095; H01L 29/12;
(Continued)

(56) References Cited

U.S. PATENT DOCUMENTS 5,864,159 A     1/1999   Takahashi
2001/0025984 A1*   10/2001   Osawa ................ H01L 29/0634
                                                                               257/330
(Continued)

FOREIGN PATENT DOCUMENTS

JP          8-167711 A      6/1996
JP     2001-284584 A    10/2001
(Continued)

OTHER PUBLICATIONS

International Search Report in PCT/JP2015/069943, dated Sep. 8, 2015.

(Continued)

*Primary Examiner* — Cuong Q Nguyen
*Assistant Examiner* — Tong-Ho Kim
(74) *Attorney, Agent, or Firm* — Hauptman Ham, LLP

(57) ABSTRACT

A semiconductor device includes an element portion and a gate pad portion on the same wide gap semiconductor substrate. The element portion includes a first trench structure having a plurality of first protective trenches and first buried layers formed deeper than gate trenches. The gate pad portion includes a second trench structure having a plurality of second protective trenches and second buried layers. The second trench structure is either one of a structure where the second trench structure includes: a p-type second semicon-
(Continued)

ductor region and a second buried layer made of a conductor or a structure where the second trench structure includes a second buried layer formed of a metal layer which forms a Schottky contact. The second buried layer is electrically connected with the source electrode layer.

11 Claims, 19 Drawing Sheets

(51) Int. Cl.
  *H01L 29/739* (2006.01)
  *H01L 29/78* (2006.01)
  *H01L 29/06* (2006.01)
  *H01L 29/12* (2006.01)
  *H01L 29/10* (2006.01)
  *H01L 29/16* (2006.01)
(52) U.S. Cl.
  CPC .......... *H01L 29/1095* (2013.01); *H01L 29/12* (2013.01); *H01L 29/1608* (2013.01); *H01L 29/401* (2013.01); *H01L 29/404* (2013.01); *H01L 29/408* (2013.01); *H01L 29/66068* (2013.01); *H01L 29/739* (2013.01); *H01L 29/78* (2013.01); *H01L 29/7811* (2013.01); *H01L 29/7813* (2013.01)
(58) Field of Classification Search
  CPC . H01L 29/1608; H01L 29/401; H01L 29/404; H01L 29/408; H01L 29/66068; H01L 29/739; H01L 29/78; H01L 29/7811; H01L 29/7812

USPC .................................................. 257/77, 330
See application file for complete search history.

(56) References Cited

U.S. PATENT DOCUMENTS

| | | | |
|---|---|---|---|
| 2005/0167742 A1* | 8/2005 | Challa | H01L 21/3065 257/328 |
| 2009/0283776 A1 | 11/2009 | Iwamuro | |
| 2011/0254084 A1* | 10/2011 | Terrill | H01L 29/407 257/330 |
| 2013/0313638 A1* | 11/2013 | Yoshimochi | H01L 21/8232 257/334 |

FOREIGN PATENT DOCUMENTS

| | | |
|---|---|---|
| JP | 2007-529115 A | 10/2007 |
| JP | 2009-278067 A | 11/2009 |
| JP | 2012-243985 A | 12/2012 |
| JP | 2013-521660 A | 6/2013 |
| WO | 2016/006263 A1 | 1/2016 |

OTHER PUBLICATIONS

International Search Report in PCT/JP2015/050989, dated Apr. 7, 2015.

* cited by examiner

SEMICONDUCTOR DEVICE AND METHOD OF MANUFACTURING SEMICONDUCTOR DEVICE

CROSS-REFERENCE TO RELATED APPLICATION

The present application is a National Phase entry of International Application No. PCT/JP2015/069943, filed Jul. 10, 2015, which claims priority of Japanese Application No. 2014-143224, filed Jul. 11, 2014.

TECHNICAL FIELD

The present invention relates to a semiconductor device and a method of manufacturing a semiconductor device.

BACKGROUND

Conventionally, there has been known a semiconductor device which has a breakdown strength structure in a gate pad portion (see patent literature 1, for example).

The conventional semiconductor device 900 includes, as shown in FIG. 22 which is a plan view of the semiconductor device 900, an element portion 970 and a gate pad portion 980 on the same semiconductor substrate 910. The semiconductor substrate 910 is made of silicon, for example. A breakdown strength of the semiconductor device 900 is 60 to 300V.

As shown in FIG. 23 which is a cross-sectional view, the element portion 970 includes: an n-type low resistance semiconductor layer 912; an n-type drift layer 914 positioned on the low resistance semiconductor layer 912; a p-type body layer 916 positioned on the drift layer 914; a gate trench 918 formed by opening the body layer 916 and reaching the drift layer 914; an n-type source region 920 arranged in the inside of the body layer 916 and formed such that at least a portion of the n-type source region 920 is exposed to an inner peripheral surface of the gate trench 918; a gate insulation layer 922 formed on an inner peripheral surface of the gate trench 918; a gate electrode layer 924 formed inside the gate trench 918 by way of the gate insulation layer 922; and a source electrode layer 928 formed in an insulated manner from the gate electrode layer 924 and being brought into contact with the source region 920. Further, the element portion 970 includes: a source trench 960 formed in the body layer 916 and the drift layer 914 such that the source trench 960 reaches the low resistance semiconductor layer 912; an insulation layer 962 formed on an inner peripheral surface of the source trench 960; and a polysilicon layer 964 formed inside the source trench 960 by way of the insulation layer 962 and being connected to the source electrode layer 928.

A cross-sectional view of the gate pad portion 980 is shown in FIG. 24. Although most of constitutional elements of the gate pad portion 980 are substantially equal to the constitutional elements of the element portion 970 shown in FIG. 22, a gate electrode line 966 is provided in place of the source electrode layer 928, a gate trench 918 has a larger width than that of the element portion 970, and a gate electrode layer 924 is connected to the gate electrode line 966. On the other hand, a source region 920 and a polysilicon layer 964 are electrically insulated from the gate electrode line 966 by a field oxide film 968. In an actual semiconductor device, the gate pad portion is connected to the outside of the device by a wire bonding or the like and hence, the gate pad portion is required to have a size of at least approximately several hundred microns.

According to the conventional semiconductor device 900, in a turn-off state, a depletion layer extending to the drift layer 914 not only extends toward the low resistance semiconductor layer 912 from the body layer 916 but also extends in a narrowing manner between neighboring source trenches 960 since a potential of the polysilicon layer 964 which faces the insulation layer 962 in an opposed manner is held at a source potential. Due to such an action, the concentration of the drift layer 914 can be increased compared to a prior art even at the same breakdown strength and hence, resistance in an ON state (ON resistance) can be reduced.

On the other hand, as a method of reducing ON resistance while acquiring a high breakdown strength, it is possible to use a wide gap semiconductor such as silicon carbide in place of silicon as a semiconductor material.

PRIOR ART LITERATURE

Patent Literature

Patent Literature 1: JP-A-2013-521660

SUMMARY OF THE INVENTION

Technical Problem

In an attempt to realize an element having a higher breakdown strength than silicon, for example, an element having a breakdown strength of 600V to 3000V by applying a wide gap semiconductor to the conventional semiconductor device 900, there arises a following drawback. That is, in the conventional semiconductor device 900, the polysilicon layer 964 is held at a source potential, while the low resistance semiconductor layer 912 is held at a drain potential. Accordingly, on a bottom portion of the source trench 960, an electric field corresponding to this potential difference is applied to the insulation layer 962. With the use of a wide gap semiconductor material, when a breakdown strength is increased ten times, for example, when the insulation layer 962 maintains the same width as the case where the element is made of silicon, an electric field which is ten times as large as an electric field applied to the element made of silicon is applied to the insulation layer 962 and hence, before the drift layer 914 electrically breaks down, the insulation layer 962 electrically breaks down and hence, a high breakdown strength cannot be realized.

On the other hand, when the drift layer 914 is depleted at the time of turning off the semiconductor device, it is necessary to extract a positive electric charge equal in amount to an absolute value of an amount of electric charge of electrons existing in the drift layer 914 from a portion of the body layer 916 arranged adjacent to the drift layer 914 and a portion of the polysilicon layer 964 arranged adjacent to the insulation layer 962. In this case, amounts of electrons to be extracted from the body layer 916 and the polysilicon layer 964 respectively are proportional to electrostatic capacitances generated between the body layer 916 and the drift layer 914 and between the polysilicon layer 964 and the drift layer 914.

The polysilicon layer 964 may be formed of a polysilicon layer having low resistance and hence, there arises no serious problem in extracting an electric charge. However, the above-mentioned extraction of holes is not always easy with respect to the body layer 916. In the element portion 970, by using a portion of the source region 220 as a p-type body contact region and by electrically connecting the portion of the source region 220 with the source electrode layer 928, the extraction of holes can be realized relatively easily. However, in the gate pad portion 980, the gate electrode line 966 exists in place of the source electrode layer 928 and hence, a similar method cannot be used. So long as the conventional semiconductor device 900 is concerned, in a portion of the gate pad portion 980 of the body layer 916, holes which are most of carriers in a p-type region are extracted to the element portion 970. In this case, since holes have small mobility (approximately one seventh of electrons in 4H-SiC, for example) and hence, resistance in the body layer 916 is liable to become high. Further, the body layer 916 is divided by the source trench 960 and hence, holes can be extracted only in an extending direction (lateral direction on a surface of paper on which FIG. 22 is drawn) of the source trench 960 and hence, as viewed from a center portion of the gate pad, it is necessary to draw around the holes by at least several hundred microns and hence, resistance is further increased. Because of such a phenomenon, the extraction of holes takes time and hence, a switching speed is delayed.

Further, at this stage of operation, a potential at a portion of the body layer 916 is increased due to a hole current and hence, a parasitic bipolar transistor formed of the drift layer 914, the body layer 916 and the source region 920 connected to the source electrode layer 928 is turned on whereby an excessively large current flows in the element thus giving rise to a possibility that the element is broken in the gate pad portion. In the case where the source region 920 is not provided to the gate pad portion 980 or in the case where the source region 920 is not connected to the source electrode layer 928, there is no concern that the parasitic bipolar transistor is turned on. In this case, however, when a potential is increased at a portion of the body layer 916, an excessively large voltage is applied to a field oxide film 968 thus giving rise to a possibility that the field oxide film 968 is electrically broken down.

In applying a wide gap semiconductor, to prevent a dielectric breakdown of the insulation layer 962, a thickness of the insulation layer 962 may be largely increased. For example, the thickness of the insulation layer 962 may be increased ten times. In such a configuration, however, an electrostatic capacitance generated between the polysilicon layer 964 and the drift layer 914 is largely lowered and hence, an amount of holes to be extracted from the body layer 916 is largely increased whereby the above-mentioned drawbacks such as lowering of a switching speed and an element breakdown or a dielectric breakdown of the field oxide film 968 due to a parasitic bipolar operation in the gate pad portion 980 become more serious.

When SiC is used as a wide gap semiconductor, ion implantation has been used in general for forming a region into which an impurity is selectively introduced as viewed from a plan view. However, an ion implanted region with high doping rate is liable to roughen a surface thereof and hence, when a highly doped region such as the source region 920 or the body contact region is arranged at a portion which oppositely faces a gate electrode line 966 by way of the field oxide film 968, there is a possibility that a breakdown strength of the field oxide film 968 is lowered.

The present invention has been made so as to overcome the above-mentioned drawbacks, and it is an object of the present invention to provide a semiconductor device which has a high breakdown strength, hardly generates irregularities in electric properties, can perform high speed switching, and has a gate pad portion which is hardly broken down. It is also an object of the present invention to provide a method of manufacturing a semiconductor device which can manufacture such a semiconductor device.

Solution to Problem

The inventors of the present invention have made extensive studies to overcome the above-mentioned drawbacks. As a result of the studies, the inventors have found that by forming a plurality of first trench structures on an element portion and by forming a plurality of second trench structures on a gate pad portion, it is possible to provide a semiconductor device which has a high breakdown strength and hardly generates irregularities in electric properties. Further, the inventors also have found that a semiconductor device which can perform high speed switching and has a gate pad portion which is hardly broken can be acquired by forming either one of the second trench structure by "the structure where a second semiconductor region is formed on a bottom portion of a second protective trench, and a second buried layer made of a conductor is formed as a second buried layer" or "the structure where a second buried layer formed of a metal layer is formed as a second buried layer".

[1] The semiconductor device according to the present invention includes: a wide gap semiconductor substrate; an element portion formed on the wide gap semiconductor substrate, the element portion comprising: a drift layer of a first conductive type; a body layer of a second conductive type opposite to the first conductive type, the body layer positioned over the drift layer; a gate trench formed so as to open in the body layer and to reach the drift layer; a source region of the first conductive type formed in a state where the source region is arranged in the inside of the body layer and at least a portion of the source region is exposed on the inner peripheral surface of the gate trench; a gate insulation layer formed on an inner peripheral surface of the gate trench; a gate electrode layer formed inside the gate trench by way of the gate insulation layer; and a source electrode layer formed in a state where the source electrode layer is insulated from the gate electrode layer and is brought into contact with the source region; and a gate pad portion formed on the wide gap semiconductor substrate, the gate pad portion comprising: a drift layer of the first conductive type; a second-conductive-type semiconductor layer of the second conductive type positioned on the drift layer; an insulation layer formed on the second-conductive-type semiconductor layer; and a gate line formed on the insulation layer, wherein the element portion further includes a first trench structure which has: a plurality of first protective trenches where the first protective trenches open in the body layer in a region between the gate trenches formed adjacently to each other and are formed deeper than the gate trenches; and a first buried layer formed inside the respective first protective trenches, and the gate pad portion further includes a second trench structure which has: a plurality of second protective trenches where the second protective trenches open in the second-conducive-type semiconductor layer and are formed deeper than the gate trenches; and a second buried layer formed inside the respective second protective trenches, the second trench structure is either one of a structure where the second trench structure further includes a second semiconductor region of the second conductive type formed on at least a bottom portion of the second protective trench, and includes a second buried layer which is made of a conductor as the second buried layer or a structure where the second trench structure includes a second buried layer which is formed of a metal layer forming a Schottky contact with the drift layer on a bottom portion and a side portion of the second protective trench as the second buried layer, and the second buried layer is electrically connected with the source electrode layer.

In this specification, "a plurality of first protective trenches" includes not only "a plurality of first protective trenches in the case where the respective protective trenches are spaced apart from each other" but also "a plurality of first protective trenches in the case where end portions of the first protective trenches arranged adjacently to each other are connected to each other thus forming one first protective trench in appearance". Further, "a plurality of second protective trenches" includes not only "a plurality of second protective trenches in the case where the respective protective trenches are spaced apart from each other" but also "a plurality of second protective trenches in the case where end portions of the second protective trenches arranged adjacently to each other are connected to each other thus forming one second protective trench in appearance".

[2] In the semiconductor device according to the present invention, it is preferable that a depth of the second protective trench be equal to a depth of the first protective trench.

[3] In the semiconductor device according to the present invention, it is preferable that a width of an opening formed in the second protective trench be equal to a width of an opening formed in the first protective trench.

[4] In the semiconductor device according to the present invention, it is preferable that the second protective trench extend to a region where the element portion is formed as viewed in a plan view.

[5] In the semiconductor device according to the present invention, it is preferable that the second protective trench be formed in a state where the second protective trench is continuously formed with the first protective trench.

[6] In the semiconductor device according to the present invention, it is preferable that the second trench structure further include a second semiconductor region of a second conductive type formed on at least a bottom portion of the second protective trench, and include a second buried layer made of a conductor as the second buried layer, and the second trench structure further include a second side wall insulation layer formed on a side portion of the second protective trench, and as the second semiconductor region, have a second semiconductor region formed on a bottom portion of the second protective trench.

[7] In the semiconductor device according to the present invention, it is preferable that the second trench structure further include a second-conductive-type second semiconductor region of a second conductive type formed on at least a bottom portion of the second protective trench, and include a second buried layer made of a conductor as the second buried layer, and the second trench structure further include: a second side wall insulation layer formed on a side portion of the second protective trench; and a second semiconductor region formed on a bottom portion and a side portion of the second protective trench as the second semiconductor region.

[8] In the semiconductor device according to the present invention, it is preferable that the second trench structure further include a second-conductive-type second semiconductor region of a second conductive type formed on at least a bottom portion of the second protective trench, and include a second buried layer made of a conductor as the second buried layer, and the second trench structure include a structure where the second trench structure includes as the second semiconductor region, a second semiconductor region formed on a bottom portion and a side portion of the second protective trench.

[9] In the semiconductor device according to the present invention, it is preferable that the first buried layer be electrically connected with the source electrode layer.

[10] In the semiconductor device according to the present invention, it is preferable that the element portion further have a third trench structure which has the same structure as the first trench structure on a more gate pad portion side than a gate trench closest to the gate pad portion among the plurality of gate trenches.

[11] In the semiconductor device according to the present invention, it is preferable that the first trench structure be either one of a structure where the first trench structure further includes a first semiconductor region of the second conductive type formed on at least a bottom portion of the first protective trench, and includes a first buried layer made of a conductor as the first buried layer or a structure where the first trench structure includes a first buried layer which is formed of a metal layer forming a Schottky contact with the drift layer on a bottom portion and a side portion of the first protective trench as the first buried layer.

[12] The method of manufacturing the semiconductor device according to the present invention, for manufacturing the semiconductor device according to any of the above-mentioned [1] to [11] includes: a wide gap semiconductor substrate preparing step of preparing the wide gap semiconductor substrate on which the element portion which includes: the drift layer of the first conductive type; the body layer of the second conductive type opposite to the first conductive type, the body layer positioned over the drift layer; and the source region of the first conductive type formed in the inside of the body layer; and the gate pad portion which includes: the drift layer of the first conductive type; and the second-conducive-type semiconductor layer of the second conductive type positioned on the drift layer; a protective trench forming step of forming collectively, the plurality of first protective trenches where the first protective trenches open in predetermined regions of the body layer in the element portion and the plurality of second protective trenches where the second protective trenches open in predetermined regions of the second-conducive-type semiconductor layer of the second conductive type in the gate pad portion; a second semiconductor region forming step of forming the second semiconductor region of the second conductive type on at least the bottom portion of the second protective trench; a gate trench structure forming step of forming the gate trench such that the gate trench opens in the body layer and reaches the drift layer, the gate insulation layer formed on the inner peripheral surface of the gate trench, and the gate electrode layer formed inside the gate trench by way of the gate insulation layer; a buried layer forming step of forming a first buried layer inside the respective first protective trenches in the element portion, and forming a second buried layer made of a conductor inside the respective second protective trenches in the gate pad portion; and an electrode layer and wiring forming step of forming a source electrode layer in a state where the source electrode layer is insulated from the gate electrode layer and is brought into contact with the source region in the element portion, and forming an insulation layer on the second conductive type semiconductor layer and forming a gate line on the insulation layer in the gate pad portion in this order, and the second buried layer is electrically connected to the source electrode layer.

[13] The method of manufacturing a semiconductor device according to the present invention for manufacturing the semiconductor device according to any one of above-mentioned [1] to [11] includes: a wide gap semiconductor substrate preparing step of preparing the wide gap semiconductor substrate on which the element portion which includes the drift layer of the first conductive type, the body layer of the second conductive type opposite to the first conductive type, the body layer positioned over the drift layer, and the source region of the first conductive type formed in the inside of the body layer; and the gate pad portion which includes the drift layer of the first conductive type; and the second-conducive-type semiconductor layer of the second conductive type which is the second conductive type positioned on the drift layer; a protective trench forming step of forming collectively, the plurality of first protective trenches where the first protective trenches open in predetermined regions of the body layer in the element portion and the plurality of second protective trenches where the second protective trenches open in predetermined regions of the semiconductor layer of the second conductive type in the gate pad portion; a gate trench structure forming step of forming the gate trench such that the gate trench opens in the body layer and reaches the drift layer, the gate insulation layer formed on the inner peripheral surface of the gate trench, and the gate electrode layer formed inside the gate trench by way of the gate insulation layer; a buried layer forming step of forming a first buried layer inside the respective first protective trenches in the element portion, and forming a second buried layer formed of a metal layer which forms a Schottky contact with the drift layer on a bottom portion and a side portion of the second protective trench in the gate pad portion; and an electrode layer and wiring forming step of forming a source electrode layer in a state where the source electrode layer is insulated from the gate electrode layer and is brought into contact with the source region in the element portion, and forming an insulation layer on the semiconductor layer of the second conductive type and forming a gate line on the insulation layer in the gate pad portion in order, and the second buried layer is electrically connected to the source electrode layer.

Advantage of Invention

According to the semiconductor device of the present invention, a second semiconductor region of the second conductive type is formed on at least a bottom portion of the second protective trench, and the second buried layer is a second buried layer made of a conductor. With such a configuration, holes (or electrons) in the second semiconductor region can be extracted through the second buried layer having a low resistance. Further, the semiconductor device of the present invention includes the second buried layer which is formed of a metal layer forming a Schottky contact with the drift layer on a bottom portion and a side portion of the second protective trench. With such a configuration, the metal layer has low resistance and hence, electric charges can be extracted through the second buried layer having low resistance. In any case, effective resistance for electric charges to be extracted as a whole at the time of turning off the semiconductor device can be lowered and hence, it takes less time for extraction of holes (or electrons) than a conventional semiconductor device whereby it is possible to provide a semiconductor device which can realize high-speed switching.

According to the semiconductor device of the present invention, the gate pad portion has the second trench structure having the above-mentioned structure and hence, it is possible to make a depletion layer spread between the second protective trenches arranged adjacently to each other at the time of turning off the semiconductor device. With such a configuration, only an extremely small portion of high voltage on a drain side is applied to a body layer (a semiconductor layer of a second conductive type) in the gate pad portion due to the second trench structure and hence, an amount of holes (or electrons) to be extracted is small. This phenomenon is equivalent to large lowering of electrostatic capacitance between the body layer and the drift layer in the gate pad portion. Accordingly, effective resistance for electric charges to be extracted as a whole at the time of turning off the semiconductor device can be further lowered and hence, the extraction of holes (or electrons) takes further less time than that of conventional semiconductor devices whereby it is possible to provide a semiconductor device which can perform further high-speed switching. Further, an amount of hole current (or electron current) which flows in the body layer at the gate pad portion at the time of turning off the semiconductor device is decreased and hence, a potential of the body layer in the gate pad portion is hardly increased. Accordingly, it is possible to prevent the occurrence of a phenomenon that a parasitic transistor is turned on in the gate pad portion so that an excessively large current flows through the element whereby the element is broken down or the occurrence of a phenomenon that an excessively large voltage is applied to a field oxide film so that a field oxide film is broken down. Accordingly, it is possible to provide a semiconductor device where a gate pad portion is hardly broken down.

According to the semiconductor device of the present invention, the element portion has the first trench structure having the above-mentioned structure and hence, it is possible to make a depletion layer spread between the first protective trenches arranged adjacently to each other at the time of turning off the semiconductor device. With such a configuration, the concentration of an electric field to a gate insulation layer on the bottom portion of the gate trench can be alleviated and hence, a dielectric breakdown of the gate insulation layer on the bottom portion of the gate trench hardly occurs. As a result, it is possible to provide a semiconductor device having a high breakdown strength.

According to the semiconductor device of the present invention, the gate pad portion has the second trench structure having the above-mentioned structure and hence, it is possible to make a depletion layer which is generated from a pn junction of the element portion and spreads in the drift layer spread to the gate pad portion whereby a curvature of the depletion layer (the degree of curvature of the depletion layer) in the vicinity of a boundary between the element portion and the gate pad portion can be decreased. Accordingly, an electric field is hardly concentrated in the gate insulation layer in the gate trench closest to the gate pad portion of the gate trench and hence, a dielectric breakdown hardly occurs. As a result, it is possible to provide a semiconductor device having a higher breakdown strength.

According to the semiconductor device of the present invention, the element portion and the gate pad portion are provided to the wide gap semiconductor substrate having a high breakdown strength and hence, it is possible to provide a semiconductor device having a higher breakdown strength.

According to the semiconductor device of the present invention, a width of the first protective trench and a width of the second protective trench can be set equal to each other and hence, a depth of the first protective trench and a depth of the second protective trench hardly become different from each other at the time of simultaneously forming the first protective trench and the second protective trench. Accordingly, it is possible to provide a semiconductor device which hardly generates irregularities in electric characteristics.

According to the semiconductor device of the present invention, the second protective trench can be formed in a state where the second protective trench is continuously formed with the first protective trench. Accordingly, a depth of the first protective trench and a depth of the second protective trench further hardly become different from each other and hence, it is possible to provide a semiconductor device which further hardly generates irregularities in electric characteristics.

According to the method of manufacturing the semiconductor device of the present invention, it is possible to manufacture the semiconductor device of the present invention having the above-mentioned technical features.

The method of manufacturing the semiconductor device of the present invention includes the protective trench forming step of collectively forming the first protective trench and the second protective trench. Accordingly, it is unnecessary to provide the step of forming the first protective trench and the step of forming the second protective trench separately and hence, it is possible to efficiently manufacture the semiconductor device of the present invention.

BRIEF DESCRIPTION OF DRAWINGS

FIG. 1A and FIG. 1B are views for explaining a semiconductor device 100 according to an embodiment 1, wherein FIG. 1A is a plan view of the semiconductor device 100, and FIG. 1B is a cross-sectional view taken along a line A-A in FIG. 1A. For facilitating the understanding of the explanation, FIG. 1A also shows a gate trench 118, a first protective trench 142 (first buried layer 144) and a second protective trench 152 (second buried layer 154) (hereinafter, the same configuration are shown also in FIG. 17 to FIG. 21). In FIG. 1B, symbol 126 indicates an interlayer insulating film.

In FIG. 12, a broken line indicates a depletion layer expanding in a drift layer 114 at the time of turning off the semiconductor device 100.

FIG. 13A is an enlarged view for explaining an extraction of holes H in a region surrounded by a broken line C in FIG. 1, and FIG. 13B is a cross-sectional view taken along a line B-B in FIG. 1A at the time of turning off the semiconductor device 100.

DESCRIPTION OF EMBODIMENTS

Figure 1A:
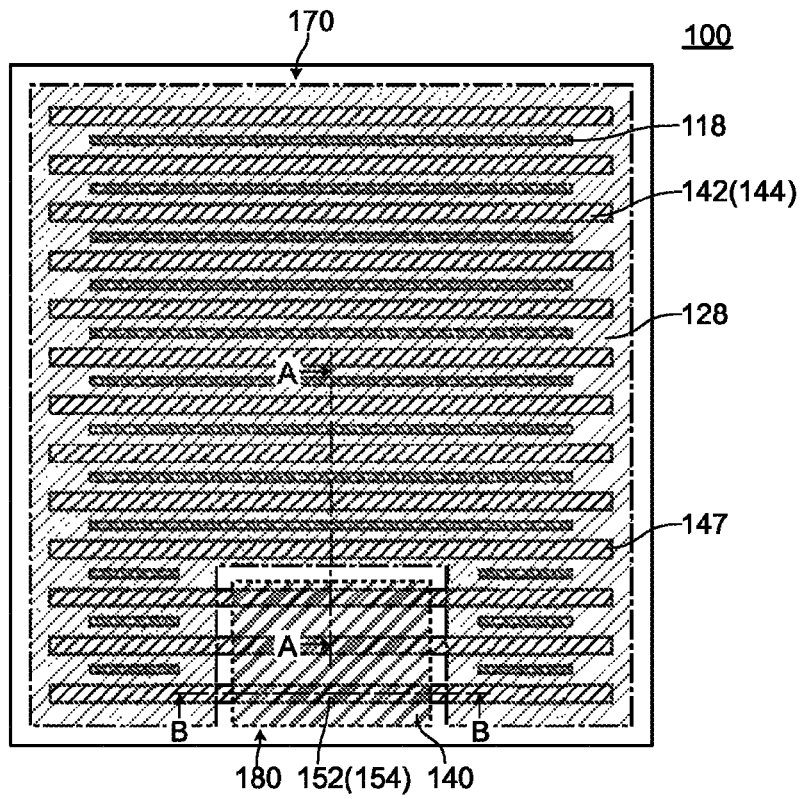

Hereinafter, a semiconductor device and a method of manufacturing a semiconductor device of the present invention are explained in conjunction with embodiments shown in the drawings. In the following embodiments, for facilitating the understanding of the explanation, drawings and explanations are partially omitted.

[Embodiment 1]

1. Configuration of Semiconductor Device 100 According to Embodiment 1

Firstly, the configuration of the semiconductor device 100 according to the embodiment 1 is explained.

As shown in FIG. 1, the semiconductor device 100 according to the embodiment 1 is a semiconductor device including an element portion 170 and a gate pad portion 180 on the same wide gap semiconductor substrate 110 (hereinafter, simply referred to as a semiconductor substrate 110 in some cases). As the wide gap semiconductor substrate 110, a SiC semiconductor substrate (for example, 4H-SiC) is used. However, a GaN semiconductor substrate, a GaAs semiconductor substrate, or any other semiconductor substrate may be used.

As shown in FIG. 1A, the gate pad portion 180 projects inward toward the element portion 170 from the outer periphery of the semiconductor device 100 thus being formed into a rectangular shape. The element portion 170 is arranged so as to surround the gate pad portion 180 from three directions as viewed in a plan view.

Figure 1B:
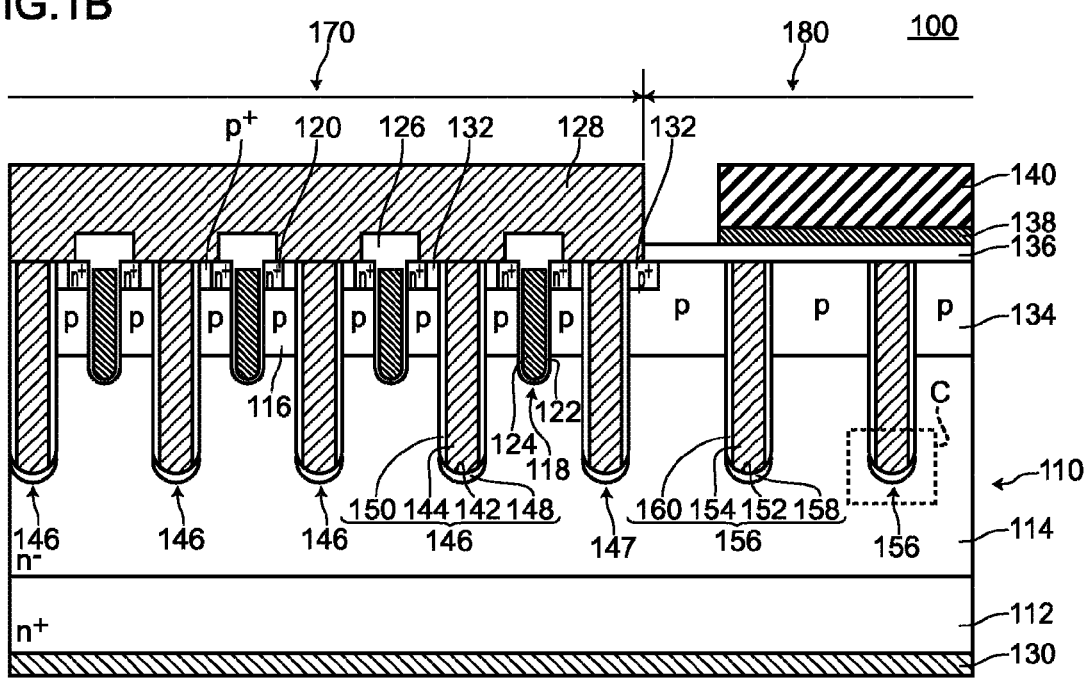

As shown in FIG. 1B, the element portion 170 includes: an n-type low resistance semiconductor layer 112; an n-type drift layer 114 positioned on the low resistance semiconductor layer 112; a p-type body layer 116 positioned on the drift layer 114; a plurality of gate trenches 118 formed so as to open in the body layer 116 and to reach the drift layer 114; an n-type source region 120 formed such that the source region 120 is arranged in the inside of the body layer 116 and at least a portion of the n-type source region 120 is exposed on an inner peripheral surface of the gate trench 118; a gate insulation layer 122 formed on an inner peripheral surface of the gate trench 118; a gate electrode layer 124 formed inside the gate trench 118 by way of the gate insulation layer 122; a source electrode layer 128 formed in a state where the source electrode layer 128 is insulated from the gate electrode layer 124 and is brought into contact with the source region 120; a p-type body contact region 132 disposed in the inside of the body layer 116; and a drain electrode layer 130 formed on a back surface side (a low resistance semiconductor layer 112 side).

The element portion 170 further includes: a first trench structure 146 which has a plurality of first protective trenches 142 where the first protective trenches 142 open in the body layer 116 in a region between the gate trenches 118 adjacent to each other and are formed deeper than the gate trench 118; and a first buried layer 144 formed inside the respective first protective trenches 142.

The first trench structure 146 is a structure where the first trench structure 146 further includes a p-type first semiconductor region 148 formed on at least a bottom portion of the first protective trench 142, and includes a first buried layer made of a conductor as the first buried layer 144, and the first trench structure 146 further includes a first side wall insulation layer 150 formed on a side portion of the first protective trench 142, and as the first semiconductor region 148, has a first semiconductor region formed on a bottom portion of the first protective trench 142.

A conductor which forms the first buried layer 144 is polysilicon having low resistance. The first buried layer 144 is electrically connected with the source electrode layer 128.

In the element portion 170, as shown in FIG. 1A, both the gate trenches 118 and the first protective trenches 142 (first trench structure 146) have a stripe shape where the gate trenches 118 and the first protective trenches 142 extends in a direction (a lateral direction in FIG. 1A) perpendicular to a direction that the gate pad portion 180 projects toward the element portion 170 from an outer periphery of the semiconductor device 100 (a longitudinal direction in FIG. 1A). The gate trenches 118 and the first protective trenches 142 are alternately formed. A pitch of the first protective trench 142 is set equal to a pitch of the gate trench 118.

The element portion 170 further has a third trench structure 147 which has the same structure as the first trench structure 146 on a more outside than an outermost periphery of the gate trench closest to the gate pad portion 180 among the plurality of gate trenches 118.

In the element portion 170, the gate trenches 118 and the first protective trenches 142 are formed also in regions on both sides of the gate pad portion 180 (the regions on left and right sides of the gate pad portion 180 in FIG. 1A). The first protective trench 142 in the region is formed in a state where the first protective trench 142 is continuously formed with the second protective trench 152 described later.

As shown in FIG. 1B, the gate pad portion 180 includes: an n-type low resistance semiconductor layer 112; an n-type drift layer 114 positioned on the low resistance semiconductor layer 112; a second-conductive-type semiconductor layer (p-type semiconductor layer) 134 positioned on the drift layer 114; an insulation layer (field insulation layer) 136 formed on the p-type semiconductor layer 134; a lower layer gate line 138 formed on the field oxide layer 136; and an upper layer gate line 140 formed above the lower layer gate line 138.

The gate pad portion 180 further includes: a second trench structure which has a plurality of second protective trenches 152 where the second protective trenches 152 open in the p-type semiconductor layer 134 and are formed deeper than the gate trench 118; and a second buried layer 154 formed inside the respective second protective trenches 152.

The second trench structure 156 further includes a p-type second semiconductor region 158 formed on at least a bottom portion of the second protective trench 152, and includes a second buried layer made of a conductor as the second buried layer 154, and the second trench structure 156 further includes a second side wall insulation layer 160 formed on a side portion of the second protective trench 152, and as the second semiconductor region 158, has a second semiconductor region formed on a bottom portion of the second protective trench 152.

A conductor which forms the second buried layer 154 is polysilicon having low resistance. The second buried layer 154 is electrically connected with the source electrode layer 128.

The conductor is polysilicon which is non-metal and hence, a field oxide film forming step can be performed before source contact metal and drain contact metal are formed. Accordingly, there is substantially no possibility that metal enters and contaminates a field oxide film thus giving rise to an advantageous effect that a reliability of a semiconductor device is enhanced.

As shown in FIG. 1A, the second protective trench 152 extends to a region where the element portion 170 is formed as viewed in a plan view, and is formed in a state where the second protective trench 152 is continuously formed with the first protective trench 142. That is, the first protective trench 142 and the second protective trench 152 are formed as one continuous straight-line trench. When two protective trenches intersect with each other, a depth of a portion where two protective trenches intersect with each other may change and hence, an electronic characteristic may be changed or irregularities may be generated in an electric characteristic.

In the gate pad portion 180, as shown in FIG. 1A, all second protective trenches 152 (second trench structure 156) have a stripe shape where the second protective trenches 152 extend in a direction (a lateral direction in FIG. 1A) perpendicular to a direction that the gate pad portion 180 projects toward the element portion 170 from an outer periphery of the semiconductor device 100 (a longitudinal direction in FIG. 1A). The second protective trenches 152 have the same pitch as the first protective trenches 142. The second protective trenches 152 are formed in the same step as the first protective trenches 142.

A depth of the second protective trench 152 is equal to a depth of the first protective trench 142. In the embodiment 1, a width of the second protective trench 152 is equal to a width of the first protective trench 142. However, the width of the second protective trench 152 may be changed as desired. A pitch of the second protective trenches 152 may be set equal to a pitch of the first protective trenches 142 or may be set different from the pitch of the first protective trenches 142. It is desirable that the gate trench 118, the first protective trench 142 and the second protective trench 152 have a cross-sectional shape where a bottom portion is rounded.

In this specification, "equal" includes not only "completely equal" but also "substantially equal".

The first buried layer 144 is formed substantially coplanar with a surface of the semiconductor substrate 110 on one surface side (a surface side on which the source region 120 and the body contact region 132 are formed).

The second buried layer 154 is formed substantially coplanar with a surface of the semiconductor substrate 110 on one surface side (a surface side on which the p-type semiconductor layer 134 is formed). With such a configuration, there is no possibility that the field oxide layer 136, the lower layer gate line 138 and the upper layer gate line 140 form a disconnected step and hence, it is possible to prevent the occurrence of a wiring defect.

The lower layer gate line 138 is made of polysilicon. The upper layer gate line 140 is made of metal, and is arranged so as to surround an outer periphery of the element portion 170. A portion of the upper layer gate line 140 is configured to project toward the element portion 170, and a projecting portion forms a region (gate pad portion 180) which is connected to an external circuit.

In the embodiment 1, unlike the conventional semiconductor device 900, a source region is not formed in the gate pad portion 180. The reason is as follows. When an SiC semiconductor substrate is used as the semiconductor substrate, a surface of a highly doped region such as the source region 120 is liable to become coarse. Accordingly, when the source region is formed in the gate pad portion 180, there is a possibility that a breakdown strength of the field oxide layer 136 is lowered at a portion which faces the lower layer gate line 138 in an opposed manner. Due to the same reason, with respect to the p-type semiconductor layer 134 existing in the gate pad portion 180, a portion of the p-type semiconductor layer 134 which faces the lower layer gate line 138 with the at least field oxide layer 136 interposed therebetween is not provided with a body contact region which is highly doped.

However, when there is no possibility that a breakdown strength of the above-mentioned field oxide layer 136 is lowered, a portion of the p-type semiconductor layer 134 existing in the gate pad portion 180 which faces the lower layer gate line 138 with the field oxide layer 136 interposed therebetween may be also formed such that the source region and/or the body contact region are/is connected with the element portion 170.

2. Method of Manufacturing Semiconductor Device According to Embodiment 1

Next, a method of manufacturing a semiconductor device according to the embodiment 1 is explained in accordance with respective steps described hereinafter.

(1) Wide Gap Semiconductor Substrate Preparing Step

A wide gap semiconductor substrate preparing step is a step of preparing the same wide gap semiconductor substrate on which the element portion 170 which includes: the n-type drift layer 114; the p-type body layer 116 positioned on the drift layer 114; and the n-type source region 120 formed in the body layer 116, and the gate pad portion 180 which includes: the n-type drift layer 114; and the p-type semiconductor layer 134 of the p type positioned on the drift layer 114.

Firstly, the semiconductor substrate 110 is prepared. The semiconductor substrate 110 is formed such that the drift layer 114 is formed as a film by an epitaxial growth method on a 4H-SiC semiconductor substrate which forms the low resistance semiconductor layer 112 (on one surface side of the low resistance semiconductor layer 112) and, thereafter, the body layer 116 is formed as a film by an epitaxial growth method in the element portion 170, and the p-type semiconductor layer 134 is formed as a film by an epitaxial growth method in the gate pad portion 180.

Figure 2A:
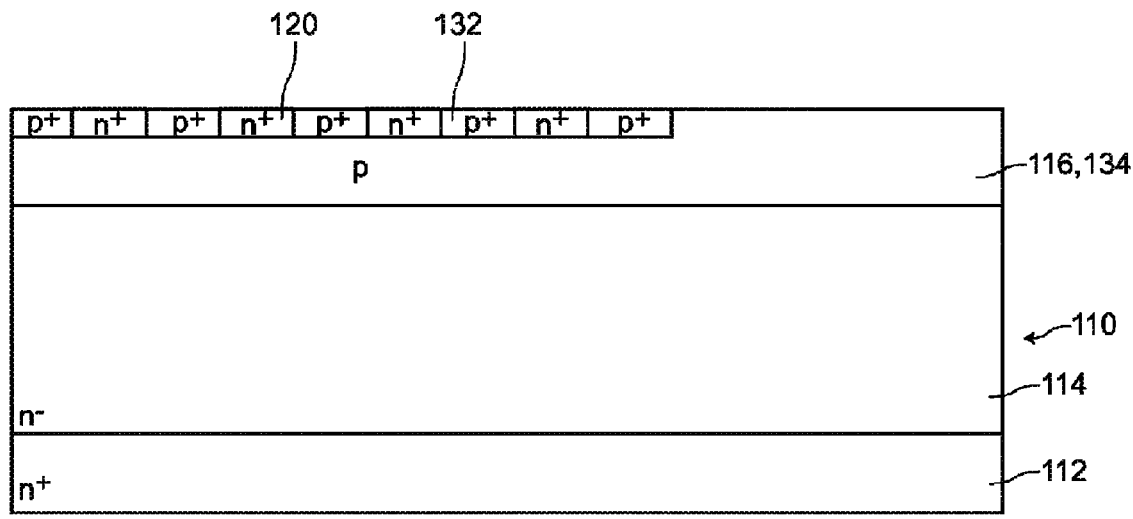
FIG. 2A and FIG. 2B are views for explaining a method of manufacturing the semiconductor device according to the embodiment 1.

Next, in the element portion 170, a mask (not shown in the drawing) having openings in regions corresponding to the source regions 120 is formed, and an n-type impurity (for example, phosphorus ions) is injected into the source regions 120 by an ion implantation method through the mask. Next, a mask (not shown in the drawing) having openings in regions corresponding to the body contact regions 132 is formed, and an p-type impurity (for example, aluminum ions) is injected into the body contact regions 132 by an ion implantation method through the mask. Next, the source regions 120 and the body contact regions 132 are formed by performing activation annealing treatment of the n-type impurity and the p-type impurity (see FIG. 2A).

(2) Protective Trench Forming Step

Figure 2B:
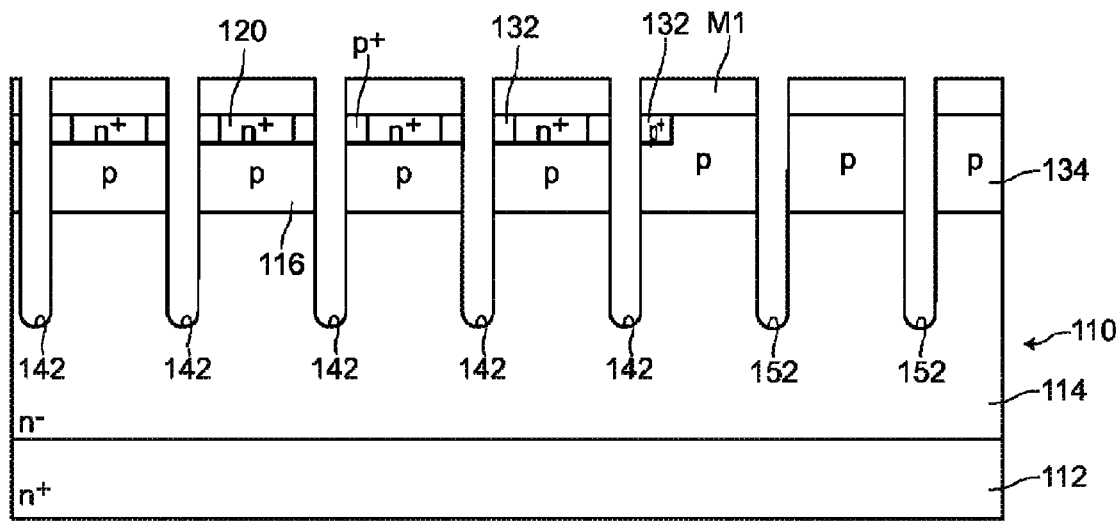

Next, a mask ($SiO_2$ mask) M1 having openings in regions corresponding to the first protective trenches 142 and regions corresponding to the second protective trenches 152 is formed. Then, the first protective trenches 142 and the second protective trenches 152 are collectively formed by forming openings in the body layer 116 and the p-type semiconductor layer 134 by an anisotropic dry etching method using the mask M1 (see FIG. 2B).

(3) Step of Forming First Semiconductor Region and Second Semiconductor Region (step of Forming Semiconductor Regions)

Figure 3A:
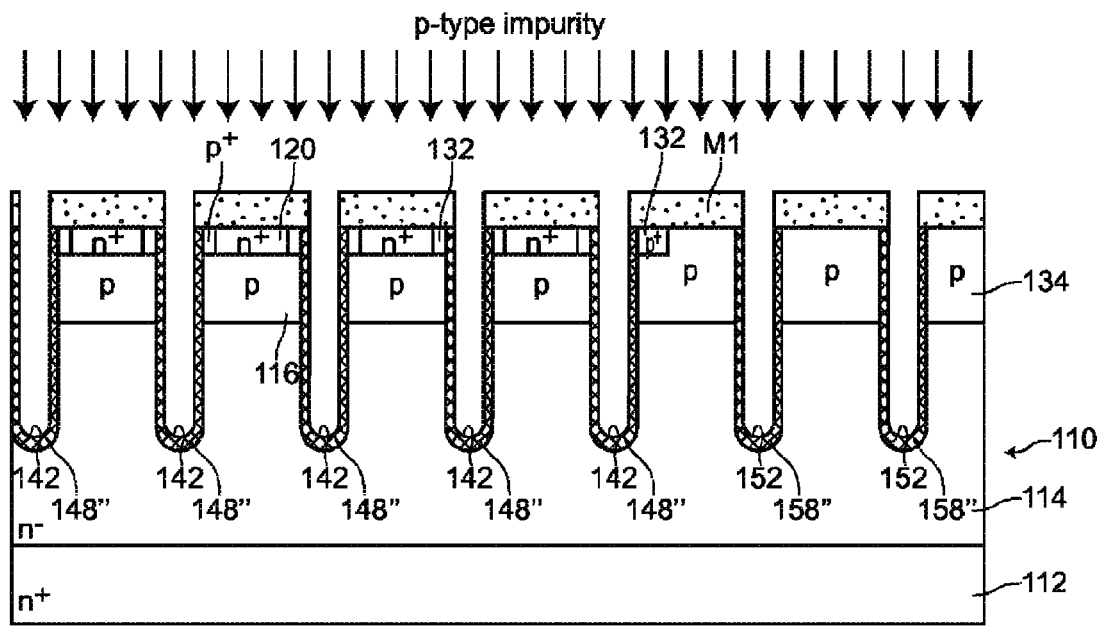
FIG. 3A and FIG. 3B are views for explaining the method of manufacturing the semiconductor device according to the embodiment 1.
Figure 3B:
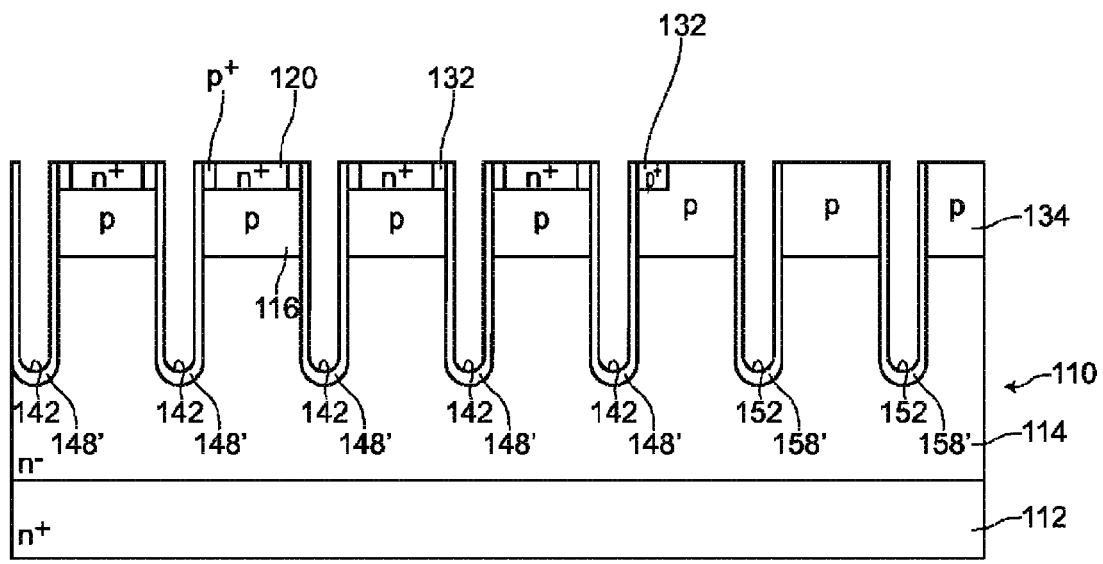

Next, a p-type impurity (for example, aluminum ions) is injected into respective surfaces of the first protective trenches 142 and the second protective trenches 152 by an ion implantation method through the mask M1 thus introducing the p-type impurity into an inner peripheral surface of the first protective trench 142 and an inner peripheral surface of the second protective trench 152 (see FIG. 3A, symbols 148" and 158" indicating the regions into which a p-type impurity is introduced in FIG. 3A). Then, the mask M1 is removed. Next, activation annealing treatment of a p-type impurity is performed by applying heat treatment to the semiconductor substrate 110 (see FIG. 3B, symbol 148' and 158' indicating the regions where a p-type impurity is activated in FIG. 3B). The activation annealing treatment of the source regions 120 and the activation annealing treatment of the body contact regions 132 may be performed simultaneously.

Figure 4A:
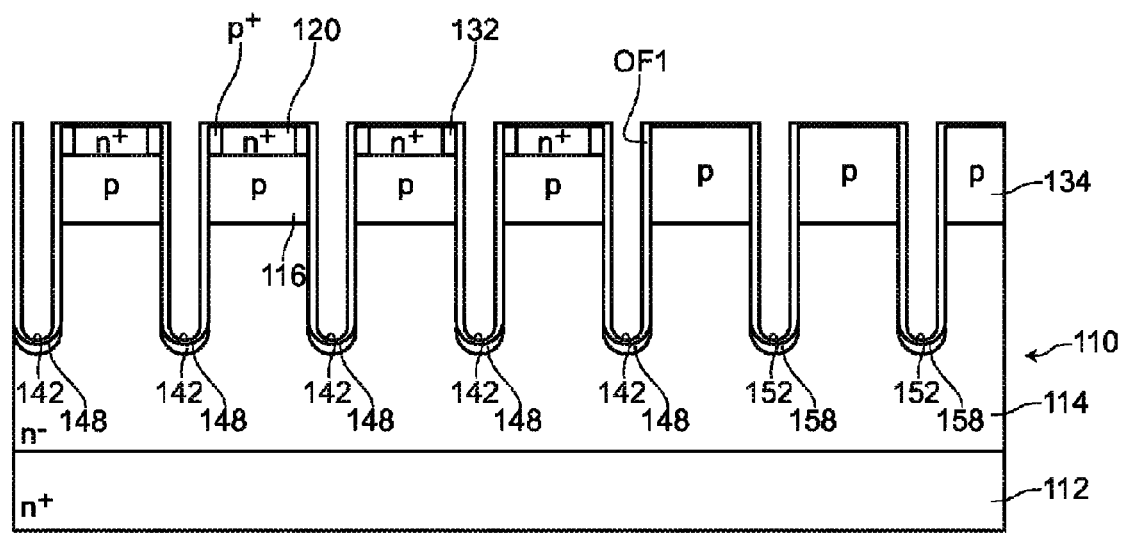
FIG. 4A and FIG. 4B are views for explaining the method of manufacturing the semiconductor device according to the embodiment 1.
Figure 4B:
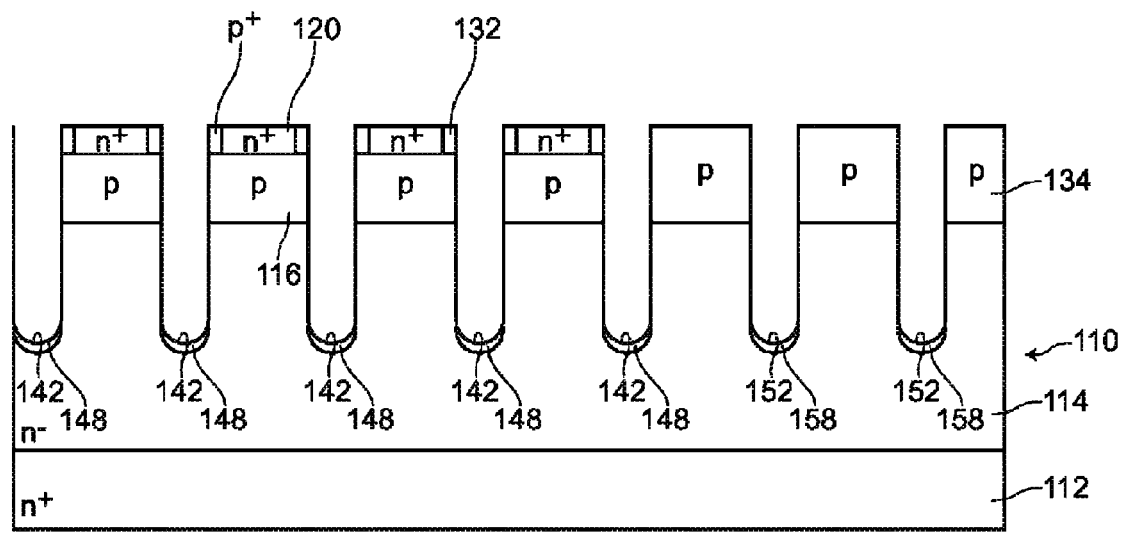

Next, a thermal oxidation step is performed. The thermal oxidation step includes: a step in which, by thermally oxidizing an inner peripheral surface of the first protective trench 142, a thermal oxide film OF1 is formed on the inner peripheral surface of the first protective trench 142, and a first semiconductor region 148 is formed on a bottom portion of the first protective trench 142; and a step in which, by thermally oxidizing an inner peripheral surface of the second protective trench 152, a thermal oxide film OF1 is formed on the inner peripheral surface of the second protective trench 152, and a second semiconductor region 158 is formed on a bottom portion of the second protective trench 152 (thermal oxidation step, see FIG. 4A). Next, the thermal oxide film OF1 formed in the thermal oxidation step is removed by etching (thermal oxide film removing step, see FIG. 4B).

When a surface of the 4H-SiC semiconductor substrate on a side where the drift layer 114 is formed is a surface on a (0001)Si plane side, oxidization speeds of respective side portions of the first protective trench 142 and the second protective trench 152 are faster than an oxidization speed of the bottom portion. Accordingly, even when the whole regions into which an impurity is introduced on the side portion are formed into a thermal oxide film, the whole regions into which an impurity is introduced on the bottom portion are not formed into a thermal oxide film. Accordingly, even when the thermal oxide film is removed thereafter, the first semiconductor region 148 remains on the bottom portion of the first protective trench 142, and the second semiconductor region 158 remains on the bottom portion of the second protective trench 152.

(4) Trench Filling Step

Figure 5A:
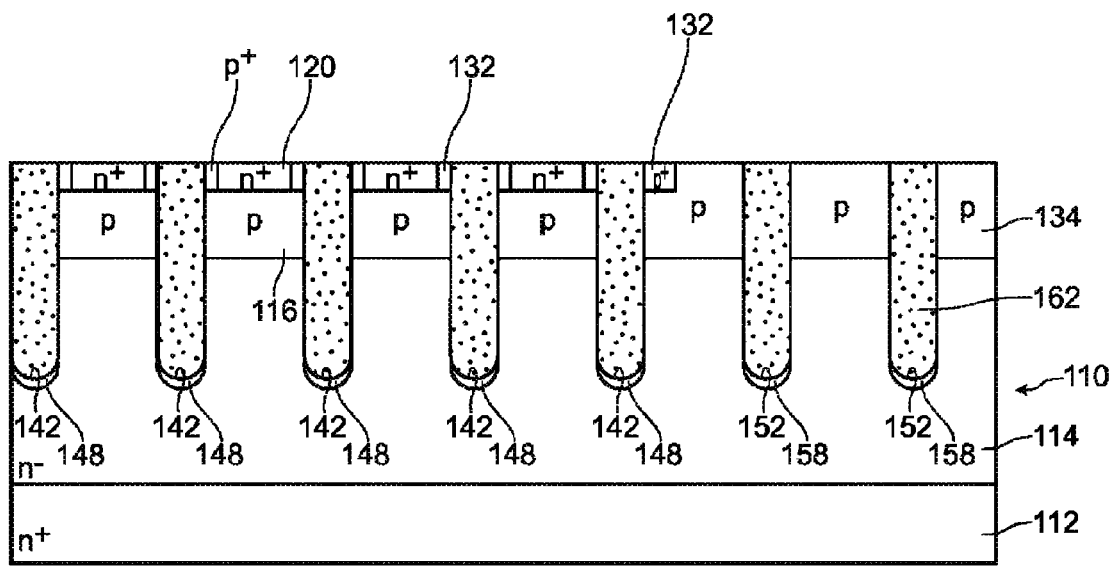
FIG. 5A and FIG. 5B are views for explaining the method of manufacturing the semiconductor device according to the embodiment 1.

Next, the inside of the first protective trenches 142 and the inside of the second protective trenches 152 are filled with silicon dioxide 162 (see FIG. 5A).

Figure 5B:
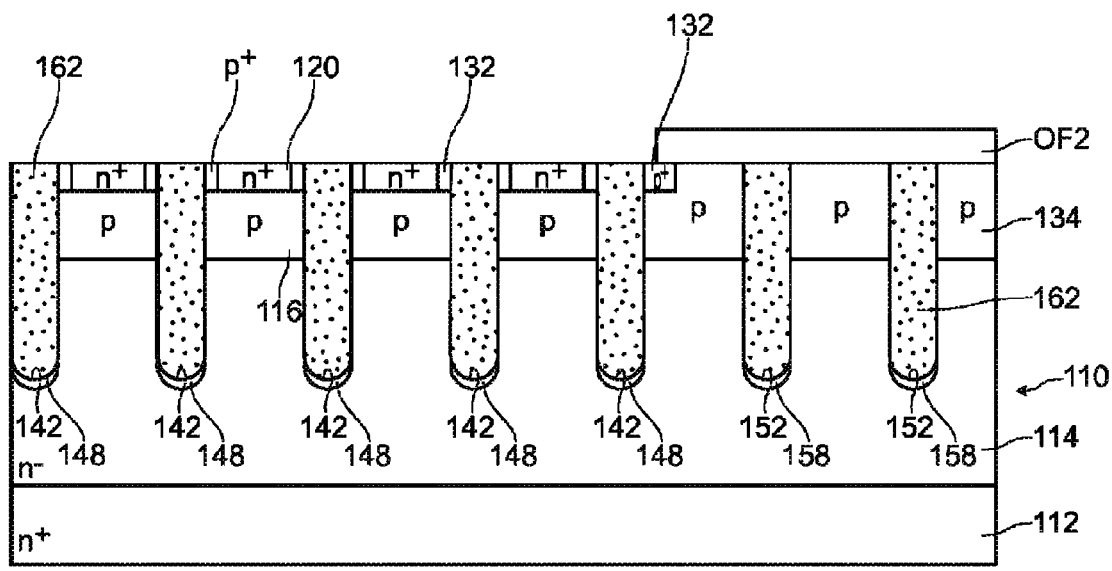

Next, a protective oxide film OF2 is formed on a surface of the semiconductor substrate 110. Then, a mask (not shown in the drawing) having an opening corresponding to the element portion 170 is formed and, thereafter, the protective oxide film OF2 in the element portion 170 is removed while leaving the protective oxide film OF2 corresponding to the gate pad portion 180 by performing etching (see FIG. 5B).

(5) Gate Trench Structure Forming Step

Figure 6A:
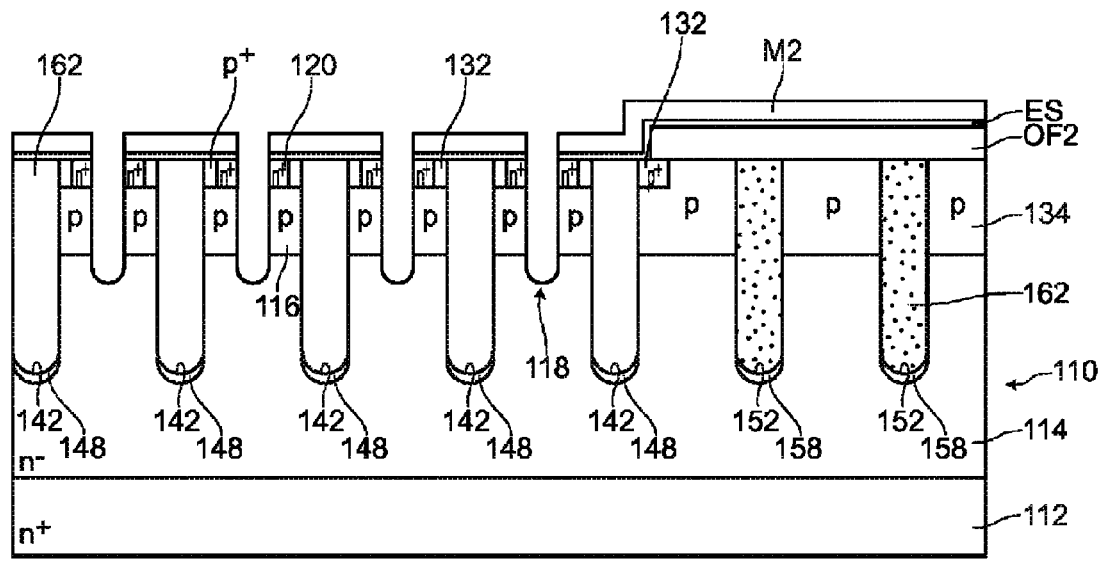
FIG. 6A and FIG. 6B are views for explaining the method of manufacturing the semiconductor device according to the embodiment 1.

Next, an etching stop film ES is formed. The etching stop film ES is made of SiN, for example. Next, a mask (SiO$_2$ mask) M2 having an opening in a region corresponding to the gate trench 118 is formed. Then, the gate trench 118 having a depth which reaches the drift layer 114 is formed by etching the etching stop film ES and the body layer 116 by an anisotropic dry etching method using the mask M2 (see FIG. 6A).

Figure 6B:
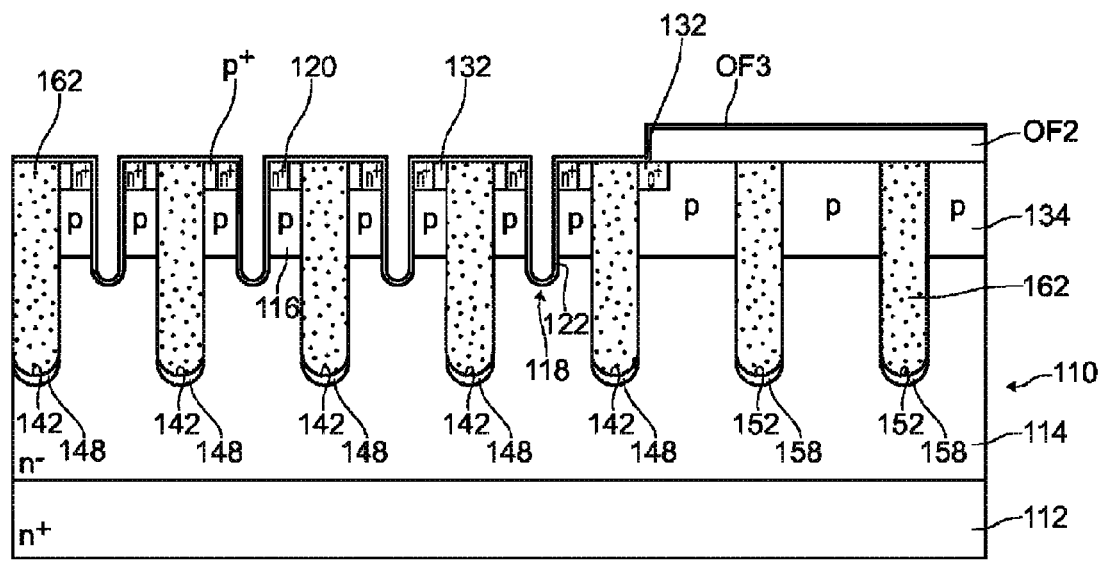

Then, the mask M2 and the etching stop film ES are removed. Next, an oxide film is formed by a CVD method and thereafter, heat treatment is performed when necessary thus forming an oxide film OF3 on an inner peripheral surface and a surface of the gate trench 118. The oxide film OF3 formed on the inner peripheral surface of the gate trench 118 becomes the gate insulation layer 122 (see FIG. 6B). In forming the gate insulation layer 122, both a thermal oxidization method and a CVD method may be used or other methods which are preferably used for forming the gate insulation layer 122 maybe also used.

Figure 7A:
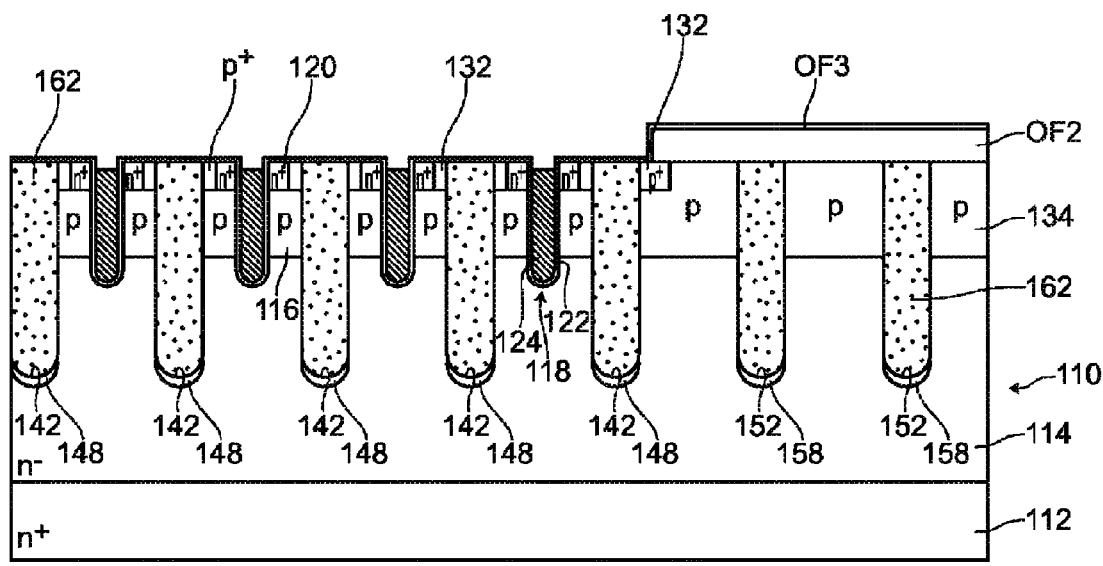
FIG. 7A and FIG. 7B are views for explaining the method of manufacturing the semiconductor device according to the embodiment 1.

Next, polysilicon having low resistance is deposited on an inner side of the gate trench 118 through the gate insulation layer 122 by a CVD method, and the gate electrode layer 124 is formed by patterning (see FIG. 7A).

(6) Step of Forming Lower Layer Portion of Interlayer Insulation Film

Next, an oxide film OF4 made of SiO$_2$ is formed over the whole region of the element portion 170 using a CVD method or the like.

Figure 7B:
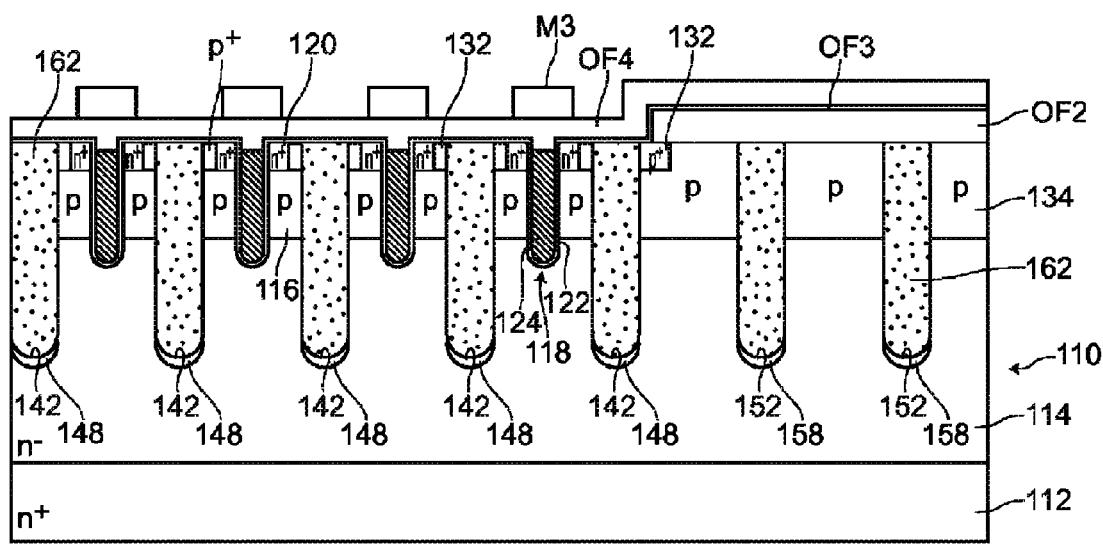

Next, a mask M3 is formed on a region corresponding to the gate electrode layer 124 (see FIG. 7B), and the oxide film OF3 and the oxide film OF4 in regions other than the above-mentioned regions are removed by anisotropic etching. At this stage of operation, a portion (or the whole) of the protective oxide film OF2 may be simultaneously removed.

Figure 8A:
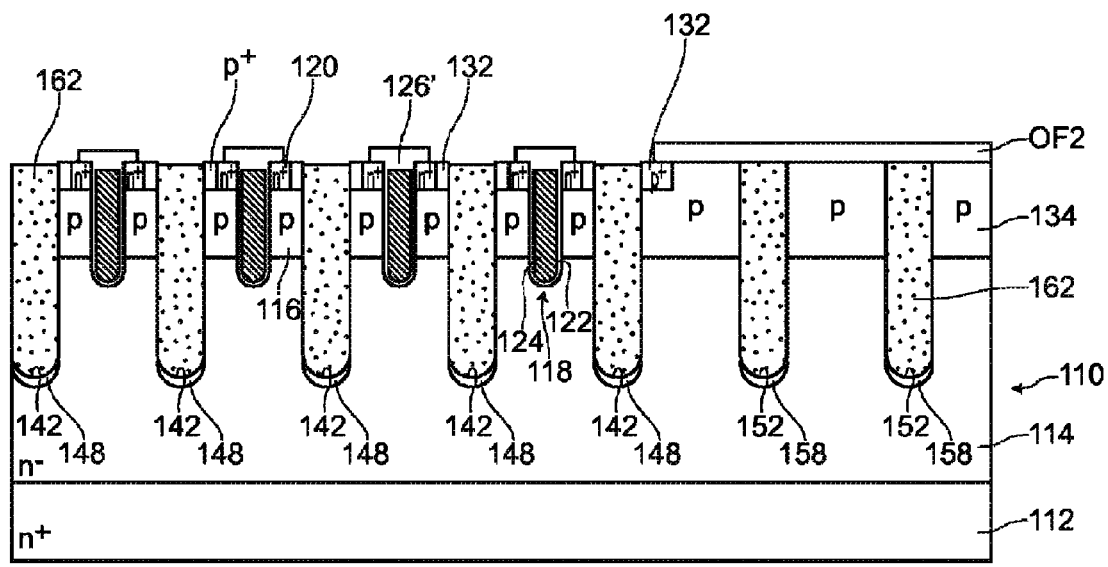
FIG. 8A and FIG. 8B are views for explaining the method of manufacturing the semiconductor device according to the embodiment 1.

With such an operation, a lower layer portion 126' of an interlayer insulation film is formed above the gate trench 118 (see FIG. 8A).

(7) Step of Removing Silicon Dioxide 162

Figure 8B:
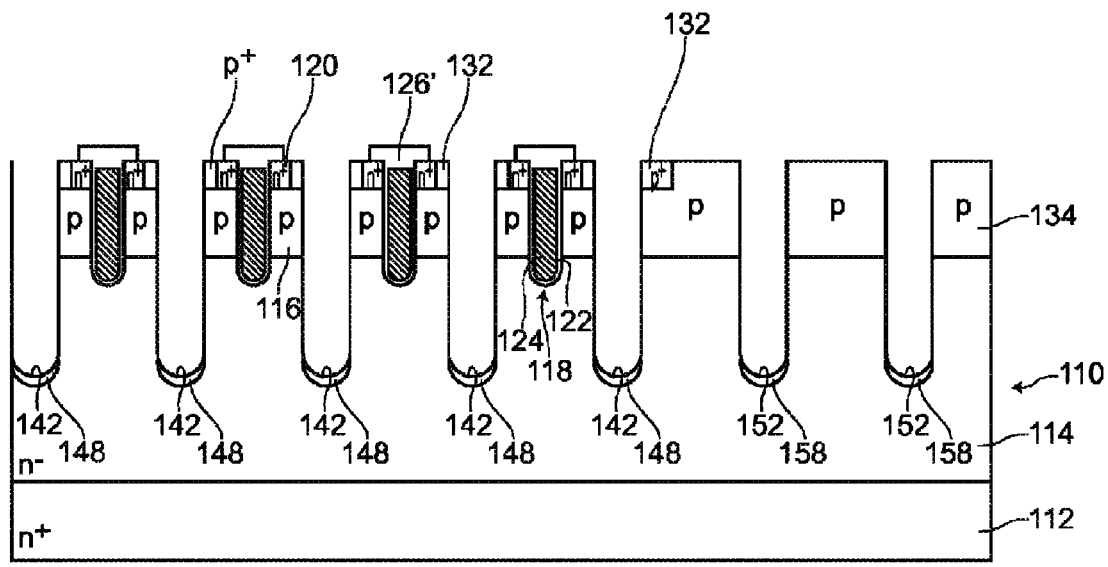
Figure 9A:
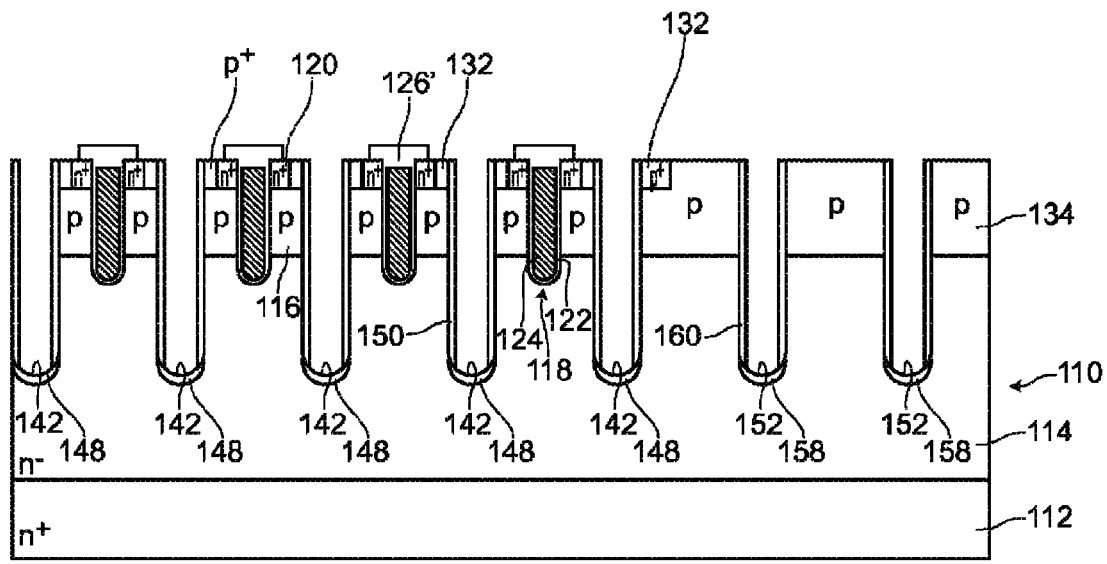
FIG. 9A and FIG. 9B are views for explaining the method of manufacturing the semiconductor device according to the embodiment 1.

Next, an etching stop film ES2 (not shown in the drawing) is formed such that the etching stop film ES2 surrounds an upper portion and the whole exposed side surfaces of the lower layer portion 126' of the interlayer insulation film, and the etching stop film ES2 has openings in regions corresponding to at least the first protective trench 142 and the second protective trench 152. Then, a remaining portion of the protective oxide film OF2 and silicon dioxide 162 buried in the first protective trenches 142 and the second protective trenches 152 are removed by a buffered hydrofluoric acid (see FIG. 8B). Thereafter, the etching stop film ES2 is removed. As the etching stop film ES2, for example, polysilicon which is not doped with ions intentionally is used. ps (8) Side Wall Insulation Layer Forming Step Next, a first side wall insulation layer 150 and a second side wall insulation layer 160 are formed on respective inner peripheral surfaces of the first protective trenches 142 and the second protective trenches 152. To be more specific, an oxide film is formed over the whole regions of the element portion 170 and the gate pad portion 180 and, thereafter, the oxide film in regions other than side portions of the first protective trenches 142 and in regions other than side portions of the second protective trenches 152 are removed by anisotropic etching thus forming the first side wall insulation layers 150 and the second side wall insulation layers 160 (see FIG. 9A).

(9) Step of Forming First Buried Layer and Second Buried Layer (Buried Layer Forming Step)

Next, source contact metal (not shown in the drawing) is formed over the whole region of the element portion 170 and the whole region of the gate pad portion 180 by a sputtering method, for example. Next, the source contact metal in regions corresponding to the interlayer insulation films 126 is removed. In place of removing the source contact metal, burner metal may be formed in advance in the regions corresponding to the interlayer insulation films 126. Next, drain contact metal (not shown in the drawing) is formed on the other surface side (low resistance semiconductor layer 112 side) of the semiconductor substrate 110. Then, heat treatment is performed at a temperature of 1000° C. thus forming an ohmic contact between the source region 120 and the source contact metal, between the body contact region 132 and the source contact metal, between the low resistance semiconductor layer 112 and the drain contact metal, between the first semiconductor region 148 and the source contact metal, and between the second semiconductor region 158 and the source contact metal respectively.

Figure 9B:
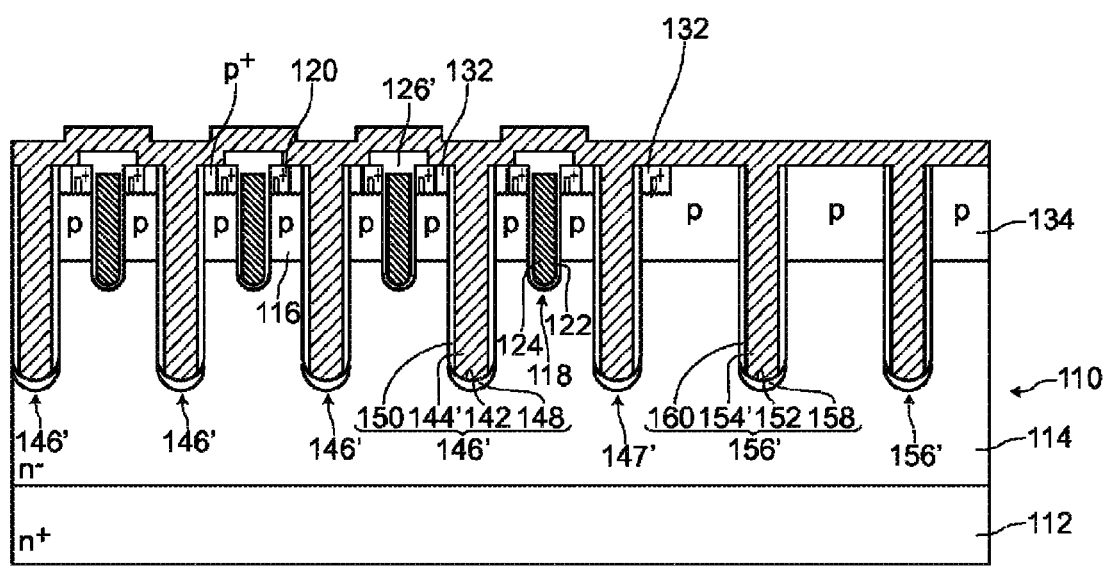
Figure 10A:
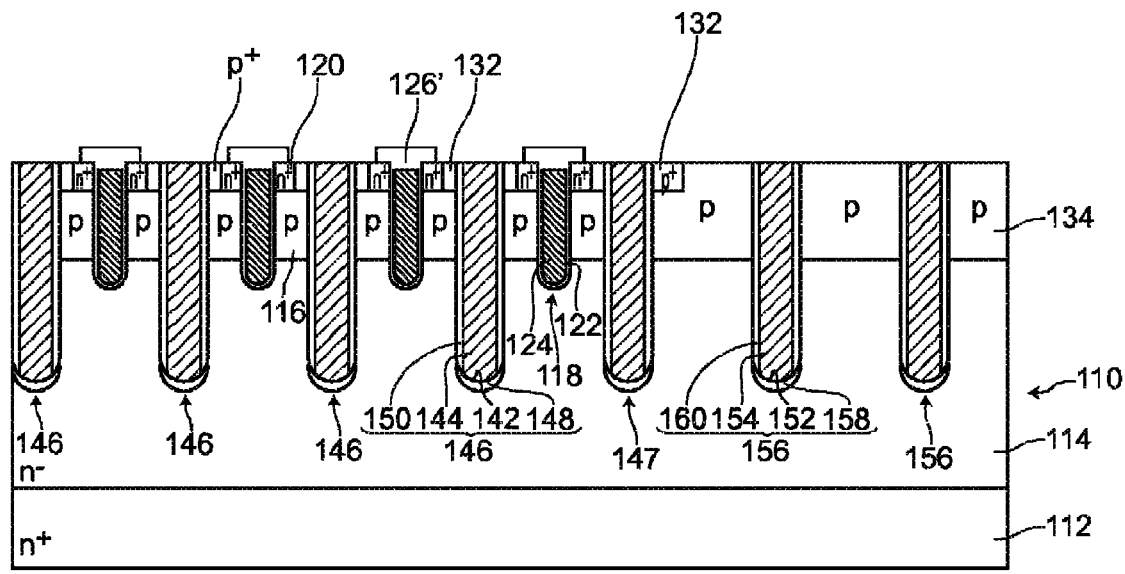
FIG. 10A and FIG. 10B are views for explaining the method of manufacturing the semiconductor device according to the embodiment 1.

Next, polysilicon is formed over the whole region of the element portion 170 and over the whole region of the gate pad portion 180 by a CVD method or the like thus filling at least an inside of the first protective trench 142 and an inside of the second protective trench 152 with polysilicon (a first polysilicon filled layer 144' and a second polysilicon filled layer 154', see FIG. 9B). This polysilicon is formed into polysilicon having low resistance by injecting an impurity of high concentration into polysilicon by doping. Next, polysilicon in regions other than the inside of the first protective trench 142 and the regions other than the inside of the second protective trench 152 are removed by etching polysilicon thus forming the first buried layer 144 made of polysilicon in the inside of the first protective trench 142 and the second buried layer 154 made of polysilicon in the inside of the second protective trench 152 (see FIG. 10A). At this stage of operation, polysilicon is removed such that both an upper surface of the first protective trench 142 and an upper surface of the second protective trench 152 become substantially coplanar with a surface of the semiconductor substrate 110.

(10) Field Oxide Film Forming Step

Figure 10B:
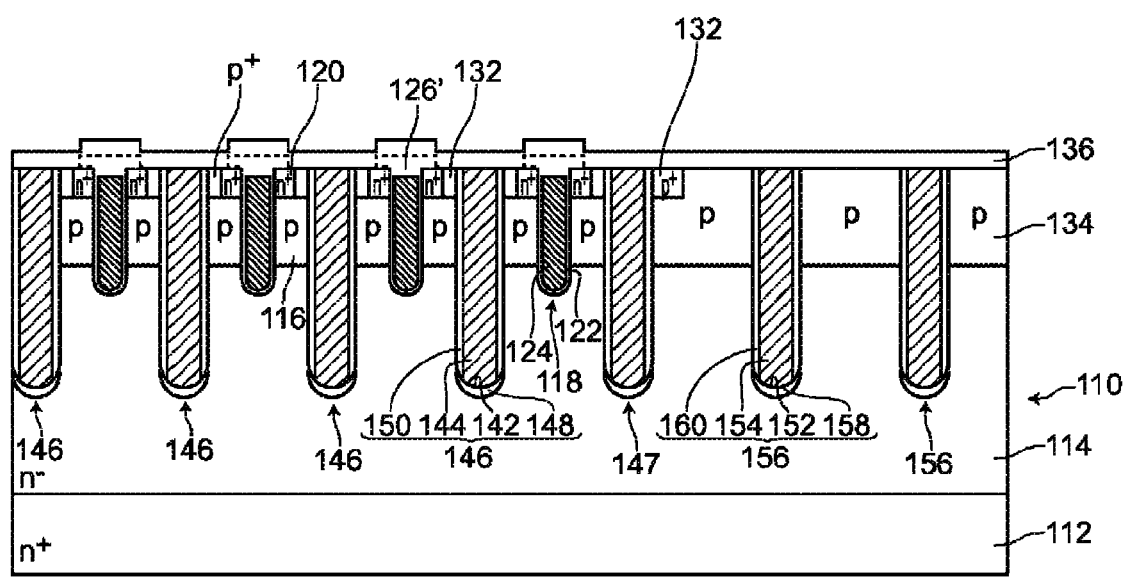

Next, the field oxide layer 136 is formed on the surface of the semiconductor substrate 110 (see FIG. 10B). At this stage of operation, on the gate trench 118, the interlayer insulation film 126 is formed of the field oxide layer 136 and a lower layer portion 126' of the interlayer insulation film.

Figure 11A:
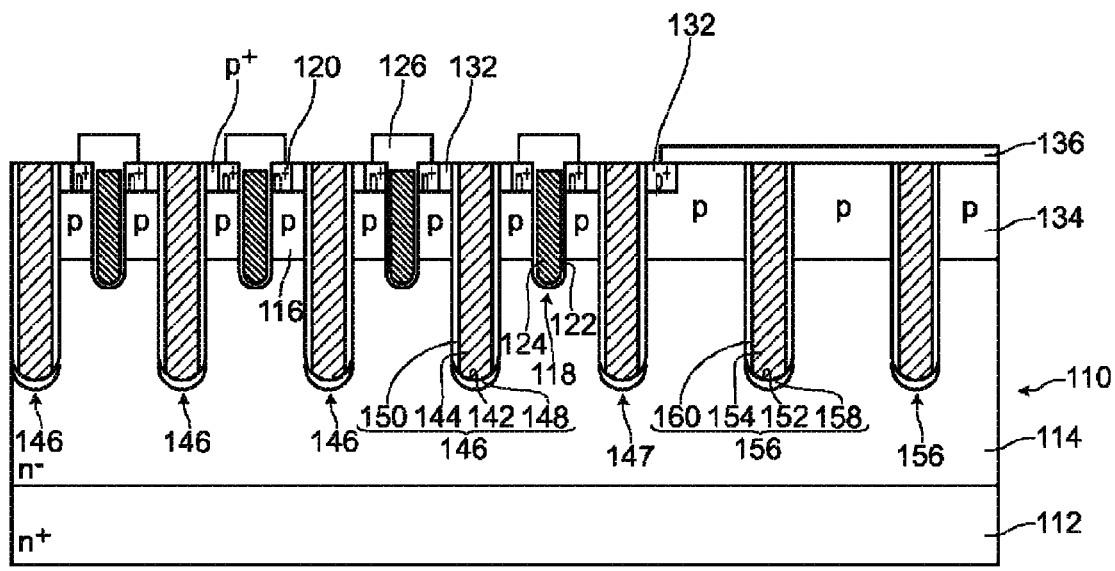
FIG. 11A and FIG. 11B are views for explaining the method of manufacturing the semiconductor device according to the embodiment 1.

Next, a mask (not shown in the drawing) having opening portions is formed on a portion of a region where the source region 120 is formed and a region where the body contact region 132 and the first trench structure 146 are formed and, thereafter, an oxide film formed on an upper surface of the first buried layer 144 is etched thus forming a source contact hole and a gate contact hole (not shown in the drawing) (see FIG. 11A).

(11) Step of Forming Source Electrode Layer, Gate Line and Drain Electrode Layer (Electrode Layer/Wiring Forming Step)

Figure 11B:
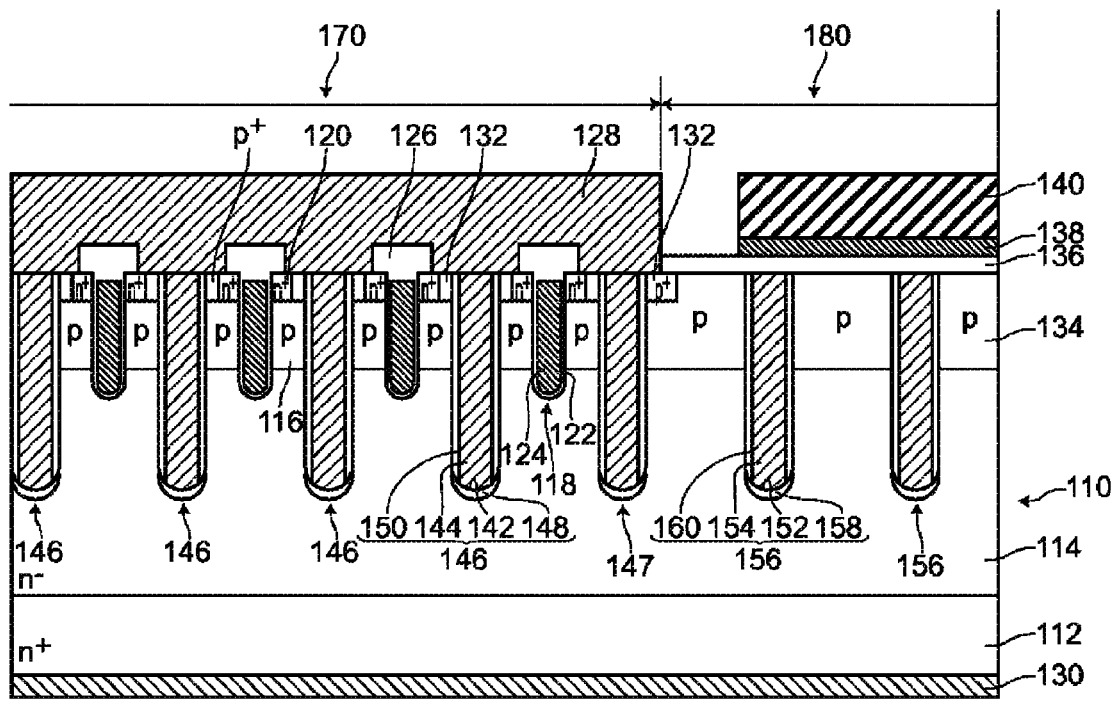

Next, a metal layer is formed over the whole region of the element portion 170 and the whole region of the gate pad portion 180, the metal layer is divided between the element portion 170 and the gate pad portion 180 thus forming the source electrode layer 128 and the gate lines (the lower layer gate line 138 and the upper layer gate line 140) (see FIG. 11B). Next, the drain electrode layer 130 is formed so as to cover the other surface side of the semiconductor substrate 110 (see FIG. 11B).

The semiconductor device 100 according to the embodiment 1 can be manufactured by executing the above-mentioned steps.

3. Effects Acquired by Semiconductor Device 100 According to Embodiment 1 and Method of Manufacturing Semiconductor Device According to Embodiment 1

According to the semiconductor device 100 of the embodiment 1, the second buried layer 154 is electrically connected with the source electrode layer 128. Accordingly, at the time of turning off the semiconductor device 100, holes existing in the second semiconductor region 158 at the bottom portion of the second protective trench 152 can be extracted into the source electrode layer 128 through the second buried layer 154 made of a conductor having extremely small resistance compared to the p-type semiconductor layer 134 (see FIG. 13). Accordingly, it takes further less time for extraction of holes than a conventional semiconductor device 900 and hence, it is possible to provide a semiconductor device which can realize high-speed switching.

Figure 12:
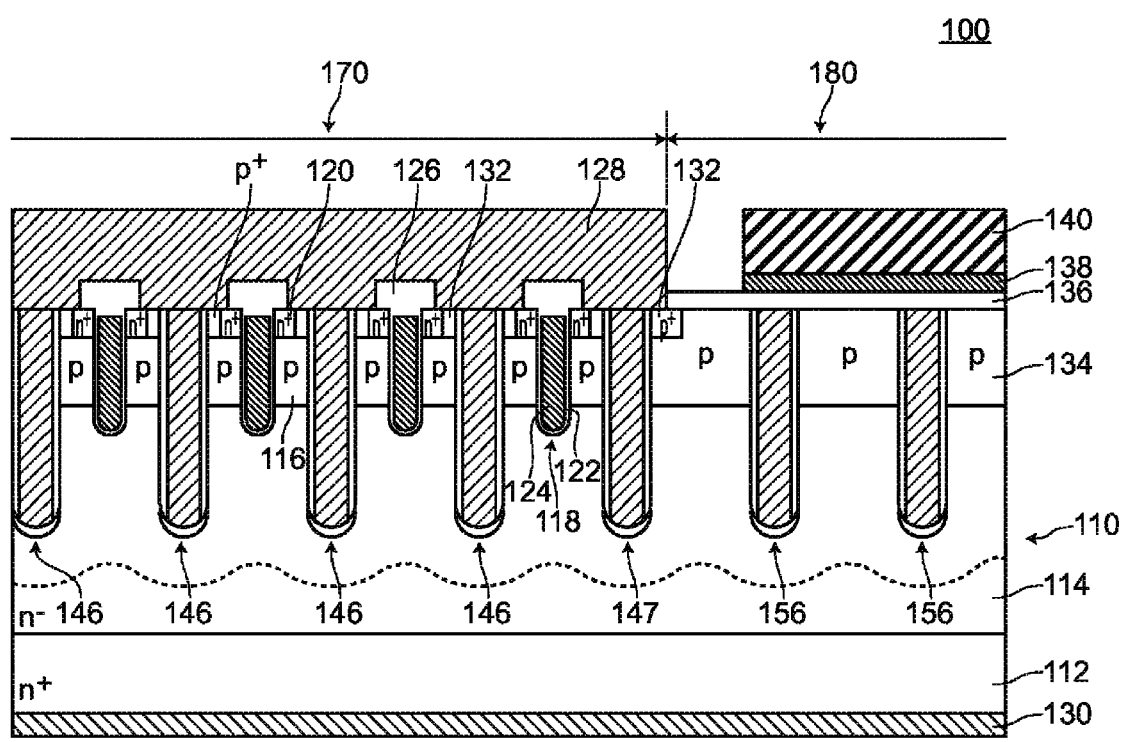
FIG. 12 is a view for explaining a state of a depletion layer of the semiconductor device 100 according to the embodiment 1 at the time of turning off the semiconductor device 100.

Further, according to the semiconductor device 100 of the embodiment 1, the semiconductor device 100 includes the second trench structure 156 having the above-mentioned structure and hence, at the time of turning off the semiconductor device 100, a depletion layer is formed from a pn junction between the second semiconductor region 158 at the bottom portion of the second protective trench 152 and the drift layer 114 (see FIG. 12). Accordingly, almost no voltage is applied to a pn junction between the p-type semiconductor layer 134 and the drift layer 114 and hence, a depletion layer is minimally formed from the pn junction whereby an amount of holes to be extracted through the p-type semiconductor layer 134 having relatively high resistance at the time of turning off the semiconductor device 100 is extremely small. Accordingly, a time necessary for extracting holes can be further decreased thus enabling further high-speed switching. Further, an amount of hole current which flows through the p-type semiconductor layer 134 is decreased and hence, a potential of the p-type semiconductor layer 134 is minimally elevated thus providing a semiconductor device having a gate pad portion which is minimally broken.

According to the semiconductor device 100 of the embodiment 1, the element portion 170 has the first trench structure 146 having the above-mentioned structure and hence, it is possible to make a depletion layer spread between the first protective trenches 142 arranged adjacently to each other at the time of turning off the semiconductor device 100 (see FIG. 12). With such a configuration, the concentration of an electric field to a gate insulation layer 122 on the bottom portion of the gate trench 118 can be alleviated and hence, a dielectric breakdown of the gate insulation layer 122 on the bottom portion of the gate trench 118 hardly occurs. As a result, it is possible to provide a semiconductor device having a high breakdown strength.

Figure 13A:
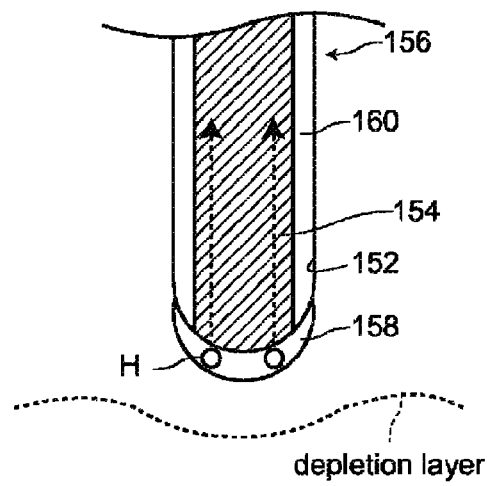
FIG. 13A and FIG. 13B are views for explaining an extraction of holes H in the semiconductor device 100 according to the embodiment 1 at the time of turning off the semiconductor device 100.
Figure 13B:
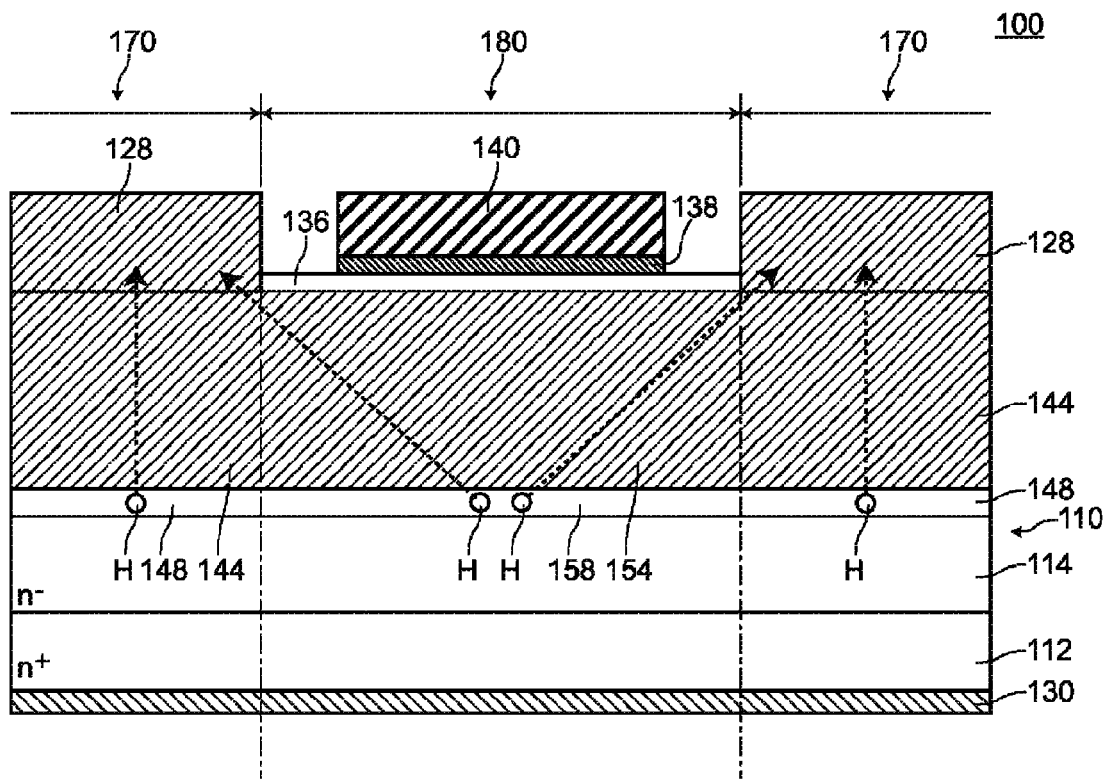

According to the semiconductor device 100 of the embodiment 1, the gate pad portion 180 has the second trench structure 156 having the above-mentioned structure and hence, it is possible to make a depletion layer which is generated from a pn junction of the element portion 170 and spreads in the drift layer 114 spread to the gate pad portion 180 whereby a curvature of the depletion layer (the degree of curvature of the depletion layer) in the vicinity of a boundary between the element portion 170 and the gate pad portion 180 can be decreased (see FIG. 13). Accordingly, an electric field is hardly concentrated in the gate insulation layer 122 in the gate trench closest to the gate pad portion 180 among the gate trenches 118 and hence, a dielectric breakdown hardly occurs. As a result, it is possible to provide a semiconductor device having a higher breakdown strength.

According to the semiconductor device 100 of the embodiment 1, the element portion 170 and the gate pad portion 180 are provided to the wide gap semiconductor substrate 110 having a high breakdown strength and hence, it is possible to provide a semiconductor device having a higher breakdown strength.

According to the semiconductor device 100 of the embodiment 1, a depth of the second protective trench 152 is equal to a depth of the first protective trench 142. Accordingly, a curvature of a depletion layer (the degree of bending of the depletion layer) in the vicinity of a boundary between the element portion 170 and the gate pad portion 180 can be decreased. As a result, it is possible to provide a semiconductor device having a higher breakdown strength.

According to the semiconductor device 100 of the embodiment 1, a width of an opening formed in the second protective trench 152 is equal to a width of an opening formed in the first protective trench 142. Accordingly, even when the second protective trenches 152 and the first protective trenches 142 are collectively formed, an etching shape and/or an etching rate of the first protective trenches 142 and an etching shape and/or an etching rate of the second protective trenches 152 do not largely differ from each other and hence, irregularities in manufacture of the semiconductor device 100 minimally occur whereby irregularities in electric characteristic caused by the irregularities in manufacture minimally occur.

According to the semiconductor device 100 of the embodiment 1, the second protective trench 152 extends to a region where the element portion 170 is formed as viewed in a plan view. Accordingly, the second buried layer 154 and the source electrode layer 128 can be easily electrically connected with each other.

According to the semiconductor device 100 of the embodiment 1, the second protective trench 152 extends to a region where the element portion 170 is formed as viewed in a plan view. Therefore, it is possible to prevent forming of an end portion of the trench having an easily collapsible etching shape on the gate pad portion 180. Accordingly, the second protective trench can be accurately formed.

According to the semiconductor device 100 of the embodiment 1, the second protective trench 152 is formed in a state where the second protective trench 152 is continuously formed with the first protective trench 142. Accordingly, not only the second buried layer 154 and the source electrode layer 128 can be easily electrically connected to each other but also a portion of the second protective trench 152 extending to the element portion 170 can be effectively used as the first protective trench.

According to the semiconductor device 100 of the embodiment 1, the second protective trench 152 is formed in a state where the second protective trench 152 is continuously formed with the first protective trench 142. Accordingly, a depth of the first protective trench and a depth of the second protective trench become further minimally different from each other thus providing a semiconductor device where irregularities in electric characteristics further minimally occur.

According to the semiconductor device 100 of the embodiment 1, the first trench structure 146 is a structure where the first trench structure 146 further includes a p-type first semiconductor region 148 formed on at least a bottom portion of the first protective trench 142, and includes a first buried layer made of a conductor as the first buried layer 144, and the first trench structure 146 further includes a first side wall insulation layer 150 formed on a side portion of the first protective trench 142, and as the first semiconductor region 148, has a first semiconductor region 148 formed on a bottom portion of the first protective trench 142. Accordingly, it is possible to provide a semiconductor device having a high breakdown strength where irregularities in electric characteristics minimally occur, high speed switching can be realized, and dielectric breakdown minimally occurs.

According to the semiconductor device 100 of the embodiment 1, the semiconductor device 100 includes the second side wall insulation layer 160 formed on a side portion of the second protective trench 152. Accordingly, it is possible to suppress a leak current which flows between the second trench structure 156 and the drift layer 114.

According to the semiconductor device 100 of the embodiment 1, the semiconductor device 100 includes the first side wall insulation layer 150 formed on a side portion of the first protective trench 142. Accordingly, it is possible to suppress a leak current which flows between the first trench structure 146 and the drift layer 114.

According to the semiconductor device 100 of the embodiment 1, the element portion 170 further has the third trench structure 147 which has the same structure as the first trench structure 146 on a more gate pad portion 180 side than a gate trench 118 closest to the gate pad portion 180 among the plurality of gate trenches 118. Accordingly, an electric field is minimally concentrated on the gate insulation layer 122 in the gate trench closest to the gate pad portion 180 among the gate trenches 118 and hence, dielectric breakdown minimally occurs.

According to the semiconductor device 100 of the embodiment 1, with respect to the p-type semiconductor layer 134 existing in the gate pad portion 180, a portion of the p-type semiconductor layer 134 which faces the lower layer gate line 138 through at least the field oxide layer 136, the source region 120 and the body contact region 132 highly doped with an impurity are not provided. Accordingly, even when the highly doped region is formed using SiC having a surface which is liable to become coarse, there is no possibility that a breakdown strength of the field oxide layer 136 is lowered thus providing a semiconductor device having the gate pad portion 180 which is minimally electrically broken.

According to the method of manufacturing a semiconductor device of the embodiment 1, it is possible to manufacture the semiconductor device 100 according to the embodiment 1 having the above-mentioned technical features.

According to the method of manufacturing a semiconductor device of the embodiment 1, the method includes a protective trench forming step where the first protective trenches 142 and the second protective trenches 152 are collectively formed. Accordingly, it is unnecessary to separately provide a step of forming the first protective trenches 142 and a step of forming the second protective trenches 152 whereby the semiconductor device 100 of the embodiment 1 can be manufactured efficiently.

[Embodiments 2 to 4]

Hereinafter, in the respective embodiments, only the differences between semiconductor devices of the respective embodiments and the semiconductor device of the embodiment 1 are explained, and the descriptions of the configurations substantially equal to the configuration of the semiconductor device of the embodiment 1 is omitted.

The semiconductor devices 100a to 100c of the embodiments 2 to 4 have substantially the same configuration as the semiconductor device 100 of the embodiment 1 basically. However, the semiconductor devices 100a to 100c of the embodiments 2 to 4 differ from the semiconductor device 100 of the embodiment 1 with respect to the configuration of the second trench structure.

Figure 14:
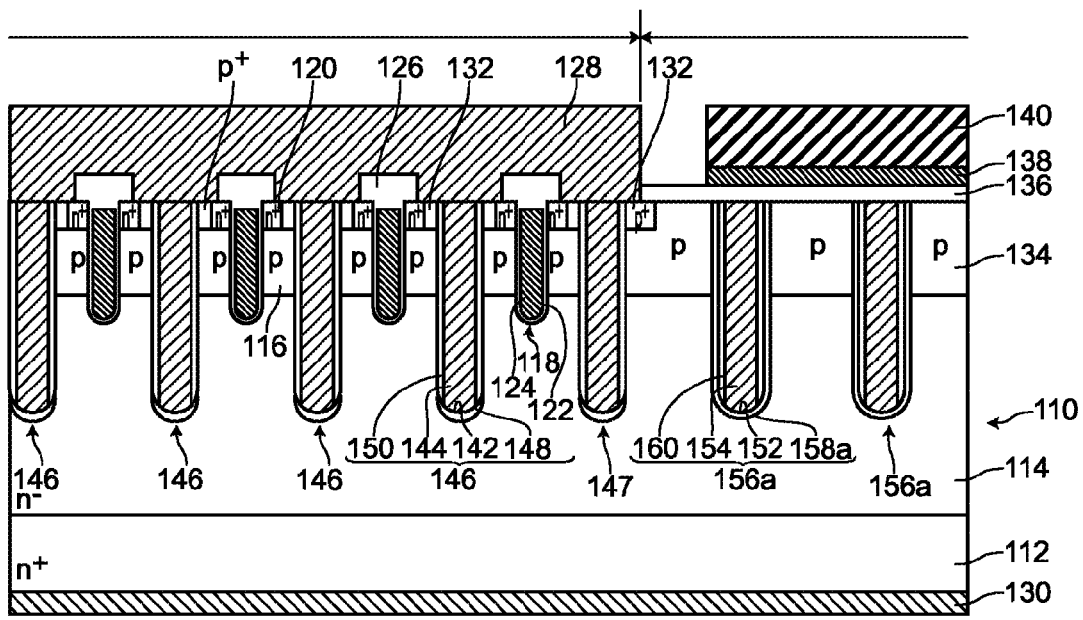
FIG. 14 is a view for explaining a semiconductor device 100a according to an embodiment 2.

That is, in the semiconductor device 100a of the embodiment 2, as shown in FIG. 14, a second semiconductor region 158a in a second trench structure 156a is formed on a bottom portion and a side portion of a second protective trench 152.

Figure 15:
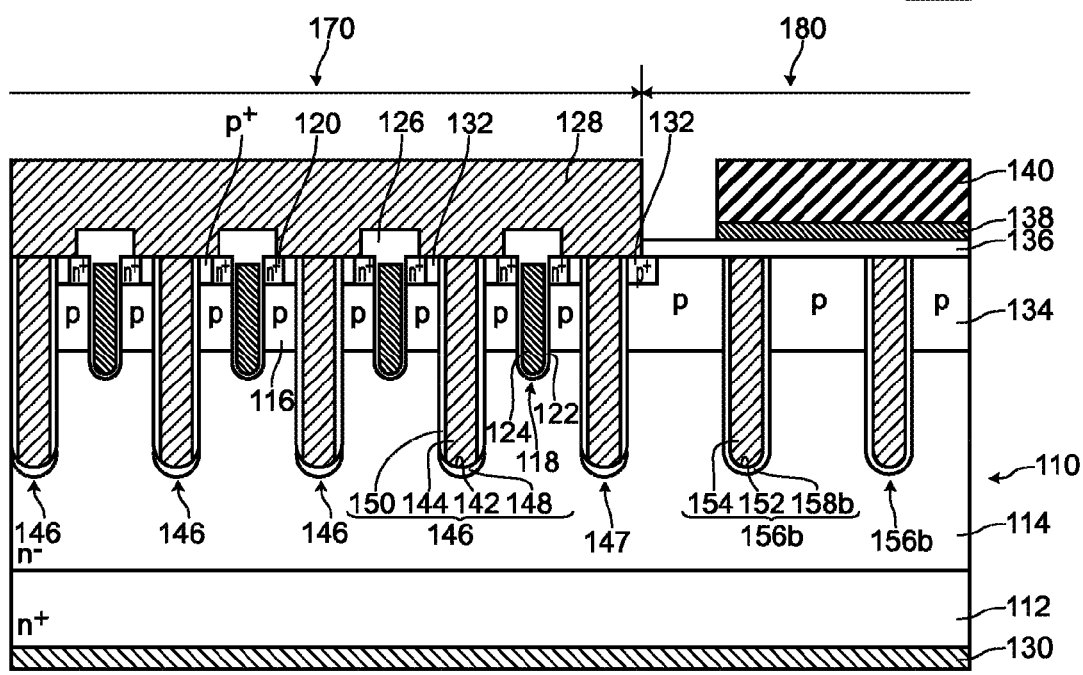
FIG. 15 is a view for explaining a semiconductor device 100b according to an embodiment 3.

In the semiconductor device 100b of the embodiment 3, as shown in FIG. 15, a second trench structure 156b does not have a second side wall insulation layer, and a second semiconductor region 158b in the second trench structure 156b is formed on a bottom portion and a side portion of a second protective trench 152.

Figure 16:
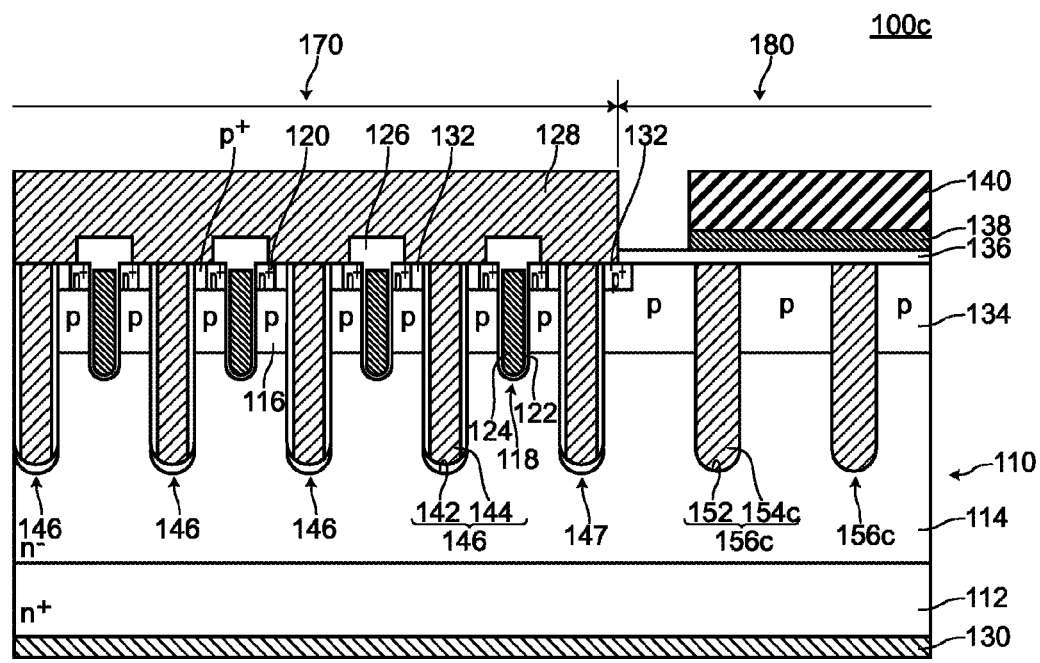
FIG. 16 is a view for explaining a semiconductor device 100c according to an embodiment 4.

Further, in the semiconductor device 100c of the embodiment 4, as shown in FIG. 16, a second trench structure 156c does not have a second side wall insulation layer and a second semiconductor region, and a second buried layer 154c is formed of a metal layer which forms a Schottky contact with a drift layer 114 on a bottom portion and a side portion of a second protective trench 152.

In the method of manufacturing a semiconductor device of the embodiment 4, a second semiconductor region forming step is not executed. Further, in a buried layer forming step, in the gate pad portion, a second buried layer formed of a metal layer which forms a Schottky contact with a drift layer is formed on a bottom portion and a side portion of the second protective trench.

In this manner, the semiconductor device 100a of the embodiment 2 and the semiconductor device 100b of the embodiment 3 differ from the semiconductor device 100 of the embodiment 1 with respect to the configuration of the second trench structure. However, in the same manner as the semiconductor device 100 of the embodiment 1, the second buried layer 154 is electrically connected with the source electrode layer 128. Accordingly, at the time of turning off the semiconductor device, holes existing in the second semiconductor regions 158a, 158b disposed on at least a bottom portion of the second protective trench 152 can be extracted to a source electrode layer 128 through a second buried layer 154 made of a conductor having an extremely small resistance compared to a p-type semiconductor layer 134. Accordingly, a time necessary for extracting holes becomes small compared to the conventional semiconductor device 900 and hence, high speed switching can be realized.

The semiconductor device 100c of the embodiment 4 differs from the semiconductor device 100 of the embodiment 1 with respect to the configuration of the second trench structure. However, in the semiconductor device 100c of the embodiment 4, a second buried layer 154 is formed of a metal layer which is electrically connected with a source electrode layer 128 and forms a Schottky contact with a drift layer 114 on a bottom portion and a side portion of a second protective trench 152. Accordingly, at the time of turning off the semiconductor device 100c, in the same manner as a Schottky diode, an amount of electric charge corresponding to depleting of the drift layer 114 can be extracted at a high speed thus enabling high speed switching.

Further, according to the semiconductor devices 100a to 100c of the embodiments 2 to 4, the semiconductor devices 100a to 100c have the second trench structure having the above-mentioned structure respectively. Accordingly, at the time of turning off the semiconductor device, a depletion layer is formed from a pn junction at a bottom portion of the second protective trench or a Schottky junction between Schottky metal and the drift layer 114. Accordingly, a voltage is minimally applied to a pn junction between a p-type semiconductor layer 134 and the drift layer 114 and hence, a depletion layer from the pn junction is minimally formed whereby an amount of holes to be extracted through the p-type semiconductor layer 134 having a relatively high resistance is extremely small at the time of turning off the semiconductor device. Accordingly, the extraction of holes takes further less time than that of conventional semiconductor devices whereby it is possible to provide a semiconductor device which can perform further high-speed switching. Further, an amount of hole current which flows in the p-type semiconductor layer 134 is decreased and hence, a potential of the p-type semiconductor layer 134 is hardly increased. Accordingly, it is possible to provide a semiconductor device where a gate pad portion is hardly broken down.

In the semiconductor devices 100a to 100c of the embodiments 2 to 4, the first trench structure may have the same configuration as the second trench structure. By adopting such configuration, the first trench structure and the second trench structure can be collectively formed.

The semiconductor devices 100a to 100c according to the embodiments 2 to 4 have substantially the same configuration as the semiconductor device 100 of embodiment 1 except for the configuration of the second trench structure. Accordingly, out of the advantageous effects which the semiconductor device 100 of the embodiment 1 acquires, the semiconductor devices 100a to 100c according to the embodiments 2 to 4 can acquire advantageous effects brought about the substantially same configuration.

Although the present invention has been explained based on the above-mentioned embodiments heretofore, the present invention is not limited to those embodiments. The present invention can be carried out in various modes without departing from the gist of the present invention, and the following modifications are also conceivable, for example.

(1) The numbers, materials and shapes of the respective constitutional elements described in the above-mentioned respective embodiments and drawings are provided only for an exemplifying the semiconductor device according to the present invention, and can be changed within a range that advantageous effects of the present invention are not impaired.

Figure 17:
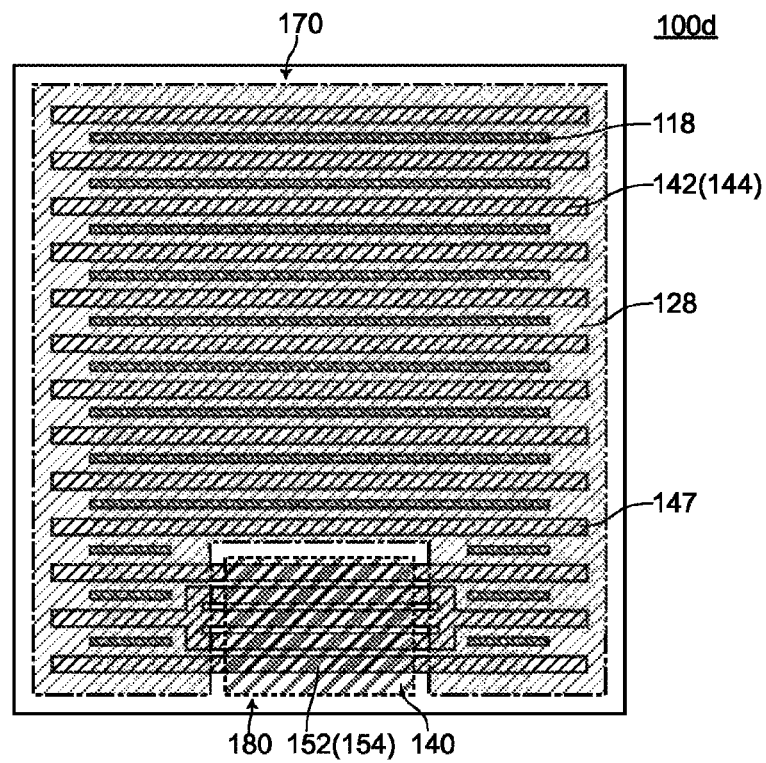
FIG. 17 is a view for explaining a semiconductor device 100d according to a modification 1.
Figure 18:
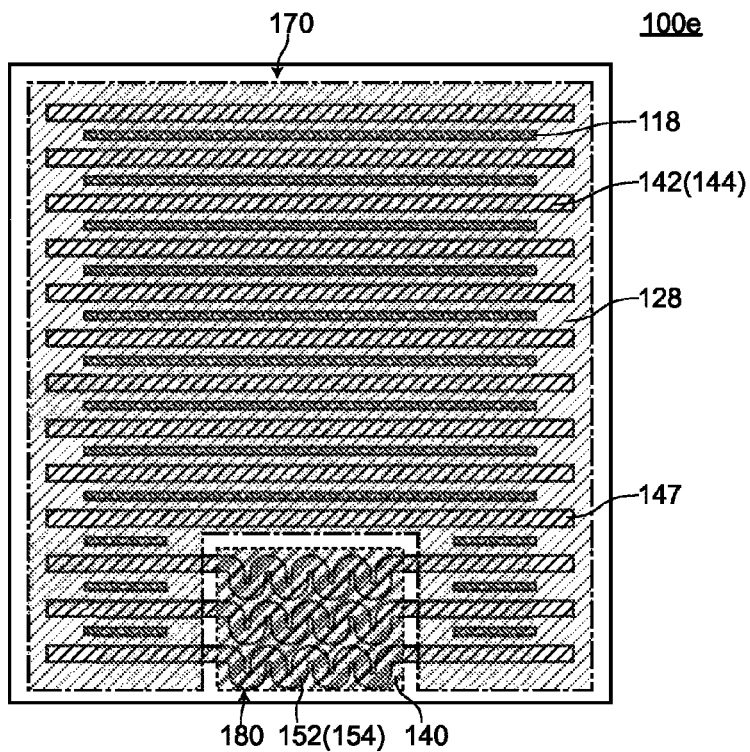
FIG. 18 is a view for explaining a semiconductor device 100e according to a modification 2.
Figure 19:
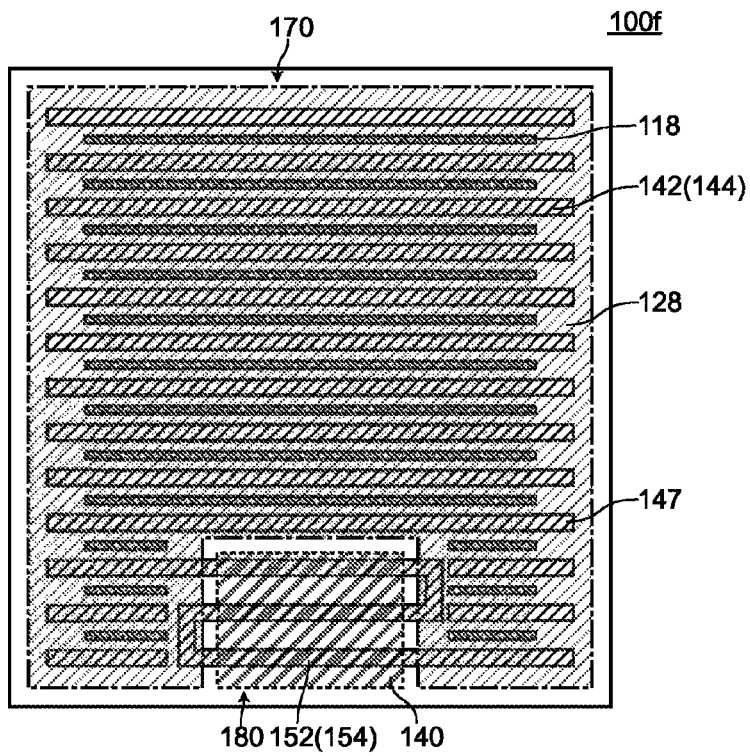
FIG. 19 is a view for explaining a semiconductor device 100f according to a modification 3.
Figure 20:
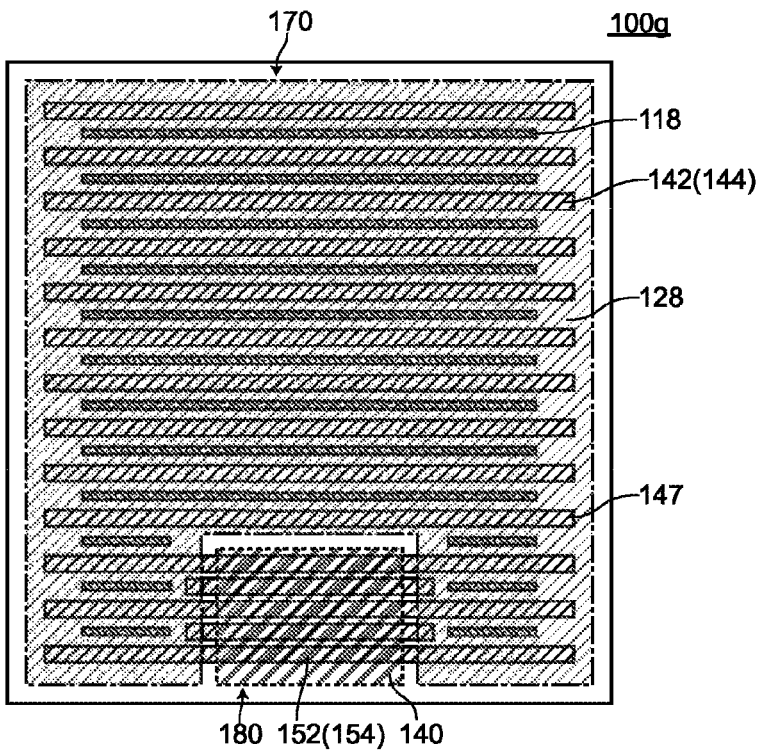
FIG. 20 is a view for explaining a semiconductor device 100g according to a modification 4.
Figure 21:
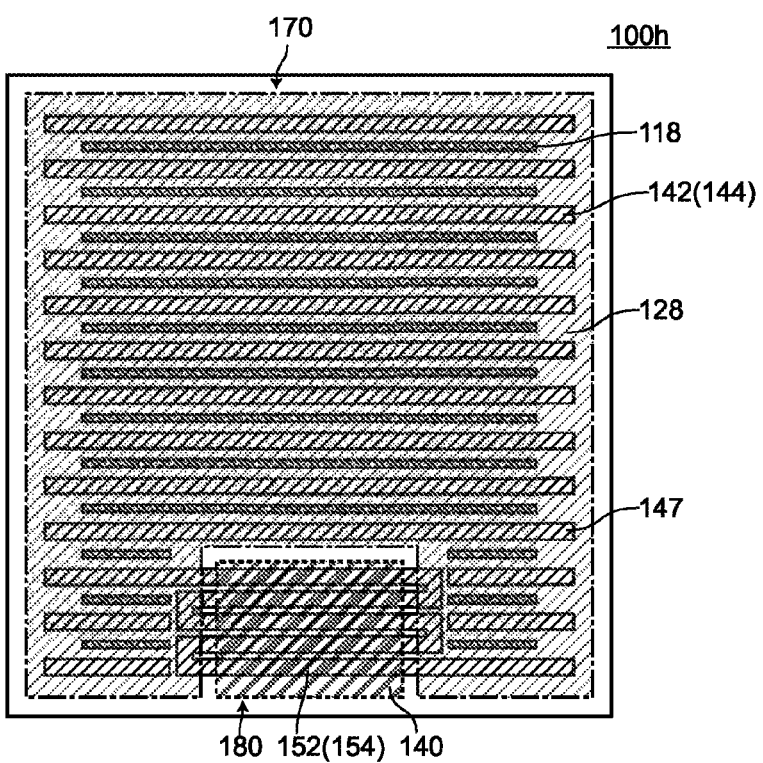
FIG. 21 is a view for explaining a semiconductor device 100h according to a modification 5.
Figure 22:
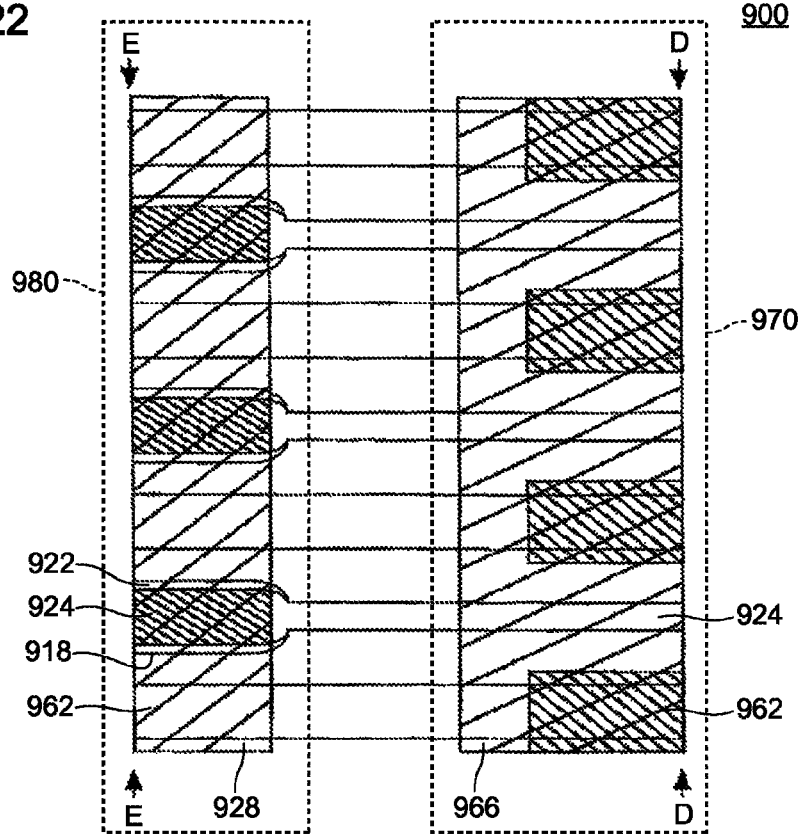
FIG. 22 is a plan view for explaining a conventional semiconductor device 900.
Figure 23:
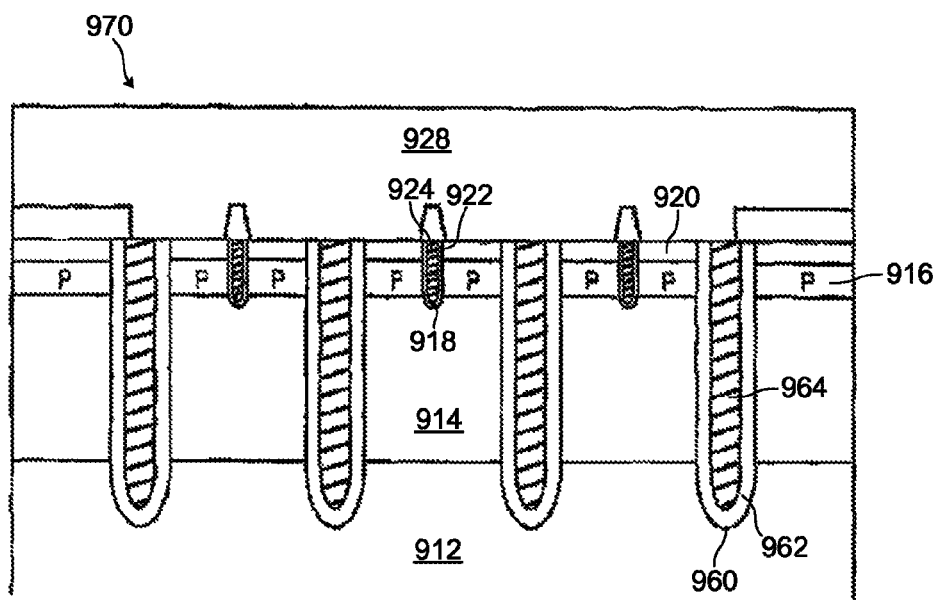
FIG. 23 is a cross-sectional view taken along a line D-D in FIG. 22 for explaining the conventional semiconductor device 900 (a cross-sectional view of an element portion 970).
Figure 24:
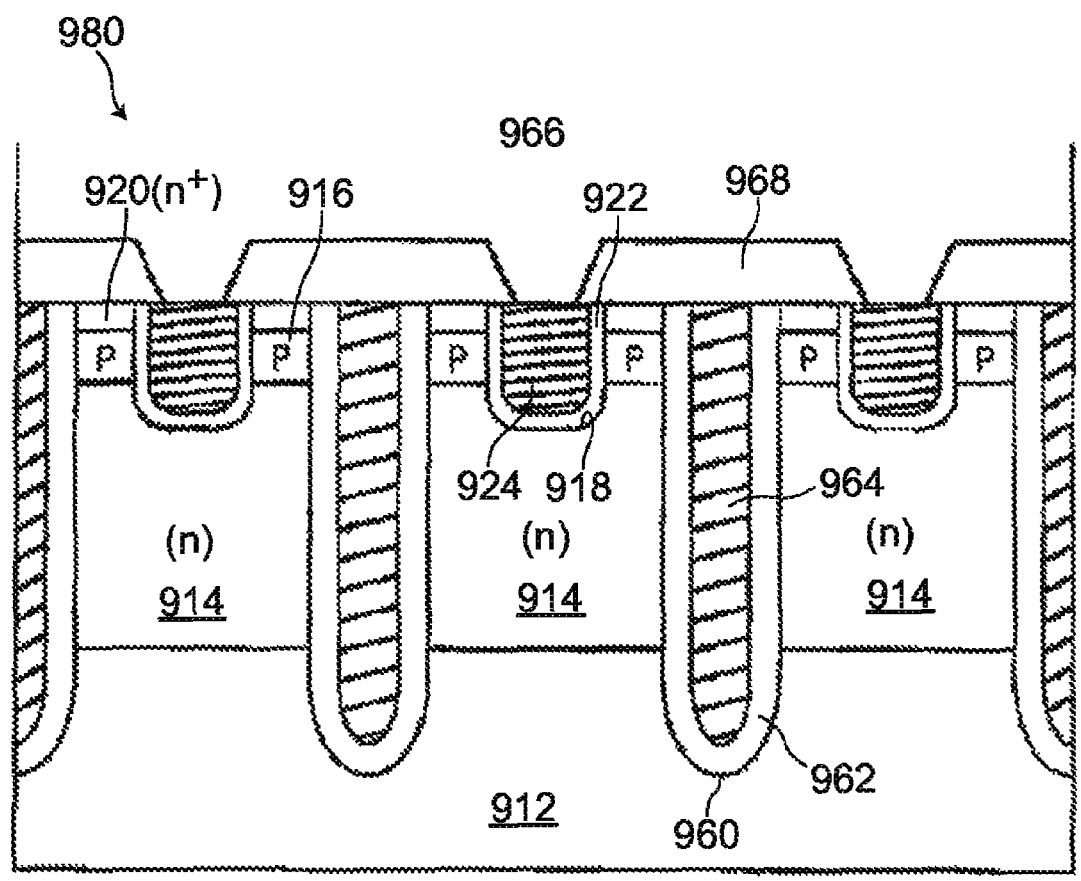
FIG. 24 is a cross-sectional view taken along a line E-E in FIG. 22 (a cross-sectional view of a gate pad portion 980) for explaining the conventional semiconductor device 900.

(2) In the above-mentioned respective embodiments, the first protective trench 142 and the second protective trench 152 are formed of one continuous straight-line trench. However, the present invention is not limited to such a trench structure. For example, trenches may be formed in the element portion such that a plurality of (three in FIG. 17) second protective trenches are branched from one first protective trench (a semiconductor device 100d of a modification 1, see FIG. 17). A trench (second protective trench) having a meandering shape maybe formed in the gate pad portion 180 (a semiconductor device 100e of a modification 2, see FIG. 18). One trench in appearance may be formed by connecting end portions of the second protective trenches (a semiconductor device 100f of a modification 3, see FIG. 19). Another second protective trench may be formed between straight-line trenches (a semiconductor device 100g of a modification 4, see FIG. 20). One trench in appearance may be formed by connecting end portions of a second protective trench and the above-mentioned another second protective trench (a semiconductor device 100h of a modification 5, see FIG. 21).

(3) In the above-mentioned respective embodiments, a MOSFET is used as the semiconductor device. However, the present invention is not limited to such a case. For example, a suitable semiconductor device such as an IGBT or a thyristor can be used as the semiconductor device.

(4) In the above-mentioned respective embodiments, the configuration of the second trench structure 156 is set equal to the configuration of the first trench structure 146. However, the configuration of the second trench structure 156 and the configuration of the first trench structure 146 may be set different from each other. Further, although the configuration of the third trench structure 147 is set equal to the configuration of the first trench structure 146, the configuration of the third trench structure 147 and the configuration of the first trench structure 146 may be set different from each other.

(5) In the above-mentioned respective embodiments, the element portion includes the third trench structure 147. However, the present invention is not limited to such a case. The element portion may not include the third trench structure 147.

(6) In the above-mentioned embodiments 1 and 2, a thermal oxide film is formed on inner peripheral surfaces of the first protective trenches and the second protective trenches and, thereafter, the first semiconductor region and the second semiconductor region are formed by removing the thermal oxide film. However, the present invention is not limited to such a case. For example, the first semiconductor region and the second semiconductor region may be formed while preventing the introduction of an impurity to respective side portions of the first protective trench and the second protective trench by forming a mask, for example.

(7) In the above-mentioned respective embodiments, the first protective trench and the second protective trench are formed in the same step. However, the present invention is not limited to such a case. The first protective trench may be formed after the second protective trench is formed or the second protective trench may be formed after the first protective trench is formed.

(8) In the above-mentioned respective embodiments, the activation annealing treatment of the source region 120 and the body contact region 132 and the activation annealing treatment of the first semiconductor region 148 and the second semiconductor region 158 are performed separately from each other. However, the present invention is not limited to such a case. The activation annealing treatment of the source region 120 and the body contact region 132 and the activation annealing treatment of the first semiconductor region 148 and the second semiconductor region 158 may be performed simultaneously.

(9) In the above-mentioned respective embodiments, the surface of the 4H-SiC semiconductor substrate on a side where the drift layer 114 is formed as a film is set as a surface on a (0001)Si plane side. However, the present invention is not limited to such a case. A surface of the 4H-SiC semiconductor substrate on a side where the drift layer 114 is formed as a film may be set as a surface on a (000-1)C plane side.

(10) In the above-mentioned respective embodiments, the body layer 116 and the p-type semiconductor layer 134 are formed by an epitaxial growth method. However, the present invention is not limited to such a case. The body layer 116 and the p-type semiconductor layer 134 may be formed by an ion implantation method.

(11) In the above-mentioned embodiments 1 to 3, polysilicon is used as a conductor for forming the second buried layer. However, the present invention is not limited to such a case. For example, the second buried layer may be formed using a non-metal conductor which includes SiN or the like as a main component and contains hydrogen or metal, for example.

The invention claimed is:

1. A semiconductor device comprising:
a wide gap semiconductor substrate;
an element portion formed on the wide gap semiconductor substrate, the element portion comprising: a low resistance semiconductor layer of a first conductive type; a drift layer of a first conductive type having a lower density of impurity than the low resistance semiconductor layer; a body layer of a second conductive type opposite to the first conductive type, the body layer positioned over the drift layer; a gate trench formed so as to open in the body layer and to reach the drift layer; a source region of the first conductive type formed in a state where the source region is arranged in the inside of the body layer and at least a portion of the source region is exposed on an inner peripheral surface of the gate trench; a gate insulation layer formed on the inner peripheral surface of the gate trench; a gate electrode layer formed inside the gate trench by way of the gate insulation layer; and a source electrode layer formed in a state where the source electrode layer is insulated from the gate electrode layer and is brought into contact with the source region; and
a gate pad portion formed on the wide gap semiconductor substrate, the gate pad portion comprising: a low resistance semiconductor layer of a first conductive type; a drift layer of the first conductive type having a lower density of impurity than the low resistance semiconductor layer; a second-conductive-type semiconductor layer of the second conductive type positioned on the drift layer; an insulation layer formed on the second-conductive-type semiconductor layer; and a gate line formed on the insulation layer, wherein
the element portion further includes a first trench structure which has: a plurality of first protective trenches where the first protective trenches open in the body layer in a region between the gate trenches formed adjacently to each other and are formed deeper than the gate trenches and shallower than the low resistance semiconductor layer; and a first buried layer formed inside the respective first protective trenches, and
the gate pad portion further includes a second trench structure which has: a plurality of second protective trenches where the second protective trenches open in the second-conductive-type semiconductor layer and are formed deeper than the gate trenches and shallower than the low resistance semiconductor layer; and a second buried layer formed inside the respective second protective trenches,
the first trench structure is either one of a structure where the first trench structure further includes a first semiconductor region of the second conductive type formed on at least a bottom portion of the first protective trench and a first buried layer which is made of a conductor as the first buried layer, and the first buried layer is connected with the drift layer through the first semiconductor region or a structure where the first trench structure includes a first buried layer which is formed of a metal layer forming a Schottky contact with the drift layer on a bottom portion and a side portion of the first protective trench as the first buried layer and the first buried layer forms the drift layer and the Schottky contact,
the second trench structure is either one of a structure where the second trench structure further includes a second semiconductor region of the second conductive type formed on at least a bottom portion of the second protective trench and a second buried layer which is made of a conductor as the second buried layer, and the second buried layer is connected with the drift layer through the second semiconductor region or a structure where the second trench structure includes a second buried layer which is formed of a metal layer forming a Schottky contact with the drift layer on a bottom portion and a side portion of the second protective trench as the second buried layer and the second buried layer forms the drift layer and the Schottky contact, and
the first buried layer and the second buried layer are electrically connected with the source electrode layer.

2. The semiconductor device according to claim 1, wherein a depth of the second protective trench is equal to a depth of the first protective trench.

3. The semiconductor device according to claim 1, wherein a width of an opening formed in the second protective trench is equal to a width of an opening formed in the first protective trench.

4. The semiconductor device according to claim 1, wherein the second protective trench extends to a region where the element portion is formed as viewed in a plan view.

5. The semiconductor device according to claim 4, wherein the second protective trench is formed in a state where the second protective trench is continuously formed with the first protective trench.

6. The semiconductor device according to claim 1, wherein the second trench structure further includes a second semiconductor region of a second conductive type formed on at least a bottom portion of the second protective trench, and includes a second buried layer made of a conductor as the second buried layer, and
the second trench structure further includes: a second side wall insulation layer formed on a side portion of the second protective trench; and a second semiconductor region formed on a bottom portion of the second protective trench as the second semiconductor region.

7. The semiconductor device according to claim 1, wherein the second trench structure further includes a second semiconductor region of a second conductive type formed on at least a bottom portion of the second protective trench, and includes a second buried layer made of a conductor as the second buried layer, and
the second trench structure further includes: a second side wall insulation layer formed on a side portion of the second protective trench; and a second semiconductor region formed in a position surrounding the second buried layer and the second side wall insulation layer on a bottom portion and a side portion of the second protective trench as the second semiconductor region.

8. The semiconductor device according to claim 1, wherein the second trench structure further includes a second semiconductor region of a second conductive type formed on at least a bottom portion of the second protective trench, and includes a second buried layer made of a conductor as the second buried layer, and
the second trench structure includes a second semiconductor region formed on a bottom portion and a side portion of the second protective trench as the second semiconductor region.

9. The semiconductor device according to claim 1, wherein the element portion further has a third trench structure which has the same structure as the first trench structure on a more gate pad portion side than a gate trench closest to the gate pad portion among the plurality of gate trenches.

10. A method of manufacturing a semiconductor device for manufacturing the semiconductor device according to claim 1, the method comprising:
a wide gap semiconductor substrate preparing step of preparing the wide gap semiconductor substrate on which the element portion which includes: the low resistance semiconductor layer of a first conductive type; the drift layer of the first conductive type having a lower density of impurity than the low resistance semiconductor layer; the body layer of the second conductive type opposite to the first conductive type, the body layer positioned over the drift layer; and the source region of the first conductive type formed in the inside of the body layer; and the gate pad portion which includes: the low resistance semiconductor layer of a first conductive type; the drift layer of the first conductive type having a lower density of impurity than the low resistance semiconductor layer; and the second-conductive-type semiconductor layer of the second conductive type positioned on the drift layer;
a protective trench forming step of forming collectively, the plurality of first protective trenches where the first protective trenches open in predetermined regions of the body layer to be shallower than the low resistance semiconductor layer in the element portion and the plurality of second protective trenches where the second protective trenches open in predetermined regions of the second-conductive-type semiconductor layer of the second conductive type to be shallower than the low resistance semiconductor layer in the gate pad portion;
a second semiconductor region forming step of forming the second semiconductor region of the second conductive type on at least the bottom portion of the second protective trench;
a gate trench structure forming step of forming the gate trench such that the gate trench opens in the body layer and reaches the drift layer, the gate insulation layer formed on the inner peripheral surface of the gate trench, and the gate electrode layer formed inside the gate trench by way of the gate insulation layer;
a buried layer forming step of forming a first buried layer inside the respective first protective trenches in the element portion, and forming a second buried layer made of a conductor inside the respective second protective trenches in the gate pad portion; and
an electrode layer and wiring forming step of forming a source electrode layer in a state where the source electrode layer is insulated from the gate electrode layer and is brought into contact with the source region in the element portion, and forming an insulation layer on the second-conductive-type semiconductor layer and forming a gate line on the insulation layer in the gate pad portion in this order, and
the second buried layer is electrically connected to the source electrode layer.

11. A method of manufacturing a semiconductor device for manufacturing the semiconductor device according to claim 1, the method comprising:
a wide gap semiconductor substrate preparing step of preparing the wide gap semiconductor substrate on which the element portion which includes: the low resistance semiconductor layer of a first conductive type; the drift layer of the first conductive type having a lower density of impurity than the low resistance semiconductor layer; the body layer of the second conductive type opposite to the first conductive type, the body layer positioned over the drift layer; and the source region of the first conductive type formed in the inside of the body layer; and the gate pad portion which includes: the low resistance semiconductor layer of a first conductive type; the drift layer of the first conductive type having a lower density of impurity than the low resistance semiconductor layer; and the second-conductive-type semiconductor layer of the second conductive type which is positioned on the drift layer;
a protective trench forming step of forming collectively, the plurality of first protective trenches where the first protective trenches open in predetermined regions of the body layer to be shallower than the low resistance semiconductor layer in the element portion and the plurality of second protective trenches where the second protective trenches open in predetermined regions of the second-conductive-type semiconductor layer to be shallower than the low resistance semiconductor layer in the gate pad portion;
a gate trench structure forming step of forming the gate trench such that the gate trench opens in the body layer and reaches the drift layer, the gate insulation layer formed on the inner peripheral surface of the gate trench, and the gate electrode layer formed inside the gate trench by way of the gate insulation layer;

a buried layer forming step of forming a first buried layer inside the respective first protective trenches in the element portion, and forming a second buried layer formed of a metal layer which forms a Schottky contact with the drift layer on a bottom portion and a side portion of the second protective trench in the gate pad portion; and an electrode layer and wiring forming step of forming a source electrode layer in a state where the source electrode layer is insulated from the gate electrode layer and is brought into contact with the source region in the element portion, and forming an insulation layer on the second-conductive-type semiconductor layer and forming a gate line on the insulation layer in the gate pad portion in this order, and the second buried layer is electrically connected to the source electrode layer.

* * * * *